(12) United States Patent
LaVoie

(10) Patent No.: US 10,832,908 B2
(45) Date of Patent: Nov. 10, 2020

(54) SELF-ALIGNED MULTI-PATTERNING PROCESS FLOW WITH ALD GAPFILL SPACER MASK

(71) Applicant: Lam Research Corporation, Fremont, CA (US)

(72) Inventor: Adrien LaVoie, Newberg, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/349,746

(22) Filed: Nov. 11, 2016

(65) Prior Publication Data

US 2018/0138040 A1    May 17, 2018

(51) Int. Cl.
| | | |
|---|---|---|
| G03F 7/26 | (2006.01) | |
| G03F 9/00 | (2006.01) | |
| H01L 21/311 | (2006.01) | |
| H01L 21/302 | (2006.01) | |
| H01L 21/308 | (2006.01) | |

(Continued)

(52) U.S. Cl.
CPC ........ *H01L 21/0337* (2013.01); *C23C 16/042* (2013.01); *C23C 16/045* (2013.01); *C23C 16/45536* (2013.01); *C23C 16/56* (2013.01); *H01L 21/0228* (2013.01); *H01L 21/02164* (2013.01); *H01L 21/02274* (2013.01); *H01L 21/0332* (2013.01); *H01L 21/31051* (2013.01); *H01L 21/31111* (2013.01); *H01L 21/0217* (2013.01); *H01L 21/02167* (2013.01); *H01L 21/02186* (2013.01)

(58) Field of Classification Search
CPC ............. H01L 21/0337; H01L 21/3088; H01L 21/3086; H01L 21/0338; H01L 21/0332; H01L 21/823821; H01L 21/0276; H01L 29/785; H01L 21/0334; H01L 29/66795; H01L 21/845; G03F 1/50
See application file for complete search history.

(56) References Cited

U.S. PATENT DOCUMENTS

| | | |
|---|---|---|
| 4,158,717 A | 6/1979 | Nelson |
| 4,419,809 A | 12/1983 | Riseman et al. |

(Continued)

FOREIGN PATENT DOCUMENTS

| | | |
|---|---|---|
| CN | 1732288 A | 2/2006 |
| CN | 1841676 A | 10/2006 |

(Continued)

OTHER PUBLICATIONS

U.S. Notice of Allowance dated Aug. 18, 2015 issued in U.S. Appl. No. 14/494,914.

(Continued)

*Primary Examiner* — Brian Turner
(74) *Attorney, Agent, or Firm* — Weaver Austin Villeneuve & Sampson LLP

(57) ABSTRACT

Methods and apparatuses for forming symmetrical spacers for self-aligned multiple patterning processes are described herein. Methods include depositing gapfill material by atomic layer deposition over a patterned substrate including core material and a target layer, planarizing substrate, and etching the core material to form symmetrical spacers. Gapfill material may be deposited for a duration insufficient to completely fill features such that features are underfilled.

14 Claims, 14 Drawing Sheets

(51) Int. Cl.
*H01L 29/66* (2006.01)
*H01L 21/033* (2006.01)
*C23C 16/455* (2006.01)
*C23C 16/04* (2006.01)
*C23C 16/56* (2006.01)
*H01L 21/02* (2006.01)
*H01L 21/3105* (2006.01)

(56) References Cited

U.S. PATENT DOCUMENTS

| | | |
|---|---|---|
| 4,500,563 A | 2/1985 | Ellenberger et al. |
| 4,575,921 A | 3/1986 | Bhagat |
| 4,869,781 A | 9/1989 | Euen et al. |
| 5,091,332 A | 2/1992 | Bohr et al. |
| 5,202,272 A | 4/1993 | Hsieh et al. |
| 5,230,929 A | 7/1993 | Caporiccio et al. |
| 5,314,724 A | 5/1994 | Tsukune et al. |
| 5,459,099 A | 10/1995 | Hsu |
| 5,496,608 A | 3/1996 | Matsuda et al. |
| 5,528,719 A | 6/1996 | Yamada |
| 5,670,432 A | 9/1997 | Tsai |
| 5,731,235 A | 3/1998 | Srinivasan et al. |
| 5,854,105 A | 12/1998 | Tseng |
| 5,856,003 A | 1/1999 | Chiu |
| 5,891,805 A | 4/1999 | Cheng et al. |
| 5,976,990 A | 11/1999 | Mercaldi et al. |
| 6,039,834 A | 3/2000 | Tanaka et al. |
| 6,153,519 A | 11/2000 | Jain et al. |
| 6,197,701 B1 | 3/2001 | Shue et al. |
| 6,225,175 B1 | 5/2001 | Houston |
| 6,228,779 B1 | 5/2001 | Bloom et al. |
| 6,326,322 B1 | 12/2001 | Kim et al. |
| 6,380,056 B1 | 4/2002 | Shue et al. |
| 6,395,652 B2 | 5/2002 | Kim et al. |
| 6,403,416 B1 | 6/2002 | Huang et al. |
| 6,416,822 B1 | 7/2002 | Chiang et al. |
| 6,428,859 B1 | 8/2002 | Chiang et al. |
| 6,518,167 B1 | 2/2003 | You et al. |
| 6,534,395 B2 | 3/2003 | Werkhoven et al. |
| 6,548,368 B1 | 4/2003 | Narwankar et al. |
| 6,632,478 B2 | 10/2003 | Gaillard et al. |
| 6,632,741 B1* | 10/2003 | Clevenger ........... H01L 21/0334 257/E21.036 |
| 6,638,879 B2 | 10/2003 | Hsieh et al. |
| 6,645,574 B1 | 11/2003 | Lee et al. |
| 6,709,928 B1 | 3/2004 | Jenne et al. |
| 6,730,614 B1 | 5/2004 | Lim et al. |
| 6,794,284 B2 | 9/2004 | Vaartstra |
| 6,926,798 B2 | 8/2005 | Biberger et al. |
| 6,933,245 B2 | 8/2005 | Lee et al. |
| 6,967,159 B2 | 11/2005 | Vaartstra |
| 7,019,159 B2 | 3/2006 | Dussarrat et al. |
| 7,041,335 B2 | 5/2006 | Chung |
| 7,172,792 B2 | 2/2007 | Wang et al. |
| 7,297,641 B2 | 11/2007 | Todd et al. |
| 7,300,885 B2 | 11/2007 | Hasebe et al. |
| 7,301,210 B2 | 11/2007 | Abadeer et al. |
| 7,351,668 B2 | 4/2008 | Chou et al. |
| 7,462,571 B2 | 12/2008 | Hasebe et al. |
| 7,465,669 B2 | 12/2008 | Iyer et al. |
| 7,482,247 B1 | 1/2009 | Papasouliotis et al. |
| 7,507,676 B2 | 3/2009 | Chou et al. |
| 7,510,984 B2 | 3/2009 | Saito et al. |
| 7,514,366 B2 | 4/2009 | Trivedi et al. |
| 7,611,980 B2 | 11/2009 | Wells et al. |
| 7,622,369 B1 | 11/2009 | Lee et al. |
| 7,629,267 B2 | 12/2009 | Wan et al. |
| 7,651,730 B2 | 1/2010 | Hasebe |
| 7,651,953 B2 | 1/2010 | Todd et al. |
| 7,651,959 B2 | 1/2010 | Fukazawa et al. |
| 7,682,657 B2 | 3/2010 | Sherman |
| 7,700,492 B2 | 4/2010 | Kikuchi |
| 7,713,592 B2 | 5/2010 | Nguyen et al. |
| 7,732,343 B2 | 6/2010 | Niroomand et al. |
| 7,758,920 B2 | 7/2010 | Hasebe et al. |
| 7,807,578 B2 | 10/2010 | Bencher et al. |
| 7,825,039 B2 | 11/2010 | Takahashi et al. |
| 7,910,288 B2 | 3/2011 | Abatchev et al. |
| 7,910,497 B2 | 3/2011 | Olsen et al. |
| 7,919,416 B2 | 4/2011 | Lee et al. |
| 7,939,455 B2 | 5/2011 | Clark |
| 7,964,241 B2 | 6/2011 | Hasebe et al. |
| 7,964,513 B2 | 6/2011 | Todd et al. |
| 7,989,365 B2 | 8/2011 | Park et al. |
| 8,034,673 B2 | 10/2011 | Kadonaga et al. |
| 8,080,290 B2 | 12/2011 | Hasebe et al. |
| 8,084,088 B2 | 12/2011 | Huy et al. |
| 8,105,901 B2 | 1/2012 | Cheng et al. |
| 8,119,544 B2 | 2/2012 | Hasebe et al. |
| 8,178,448 B2 | 5/2012 | Nodera et al. |
| 8,227,032 B2 | 7/2012 | Dussarrat et al. |
| 8,257,789 B2 | 9/2012 | Matsunaga et al. |
| 8,298,628 B2 | 10/2012 | Yang et al. |
| 8,298,954 B1 | 10/2012 | Arnold et al. |
| 8,366,953 B2 | 2/2013 | Kohno et al. |
| 8,383,525 B2 | 2/2013 | Raisanen et al. |
| 8,394,466 B2 | 3/2013 | Hong et al. |
| 8,592,328 B2 | 11/2013 | Hausmann et al. |
| 8,623,770 B1* | 1/2014 | Gao ................ H01L 21/02186 257/E21.236 |
| 8,669,185 B2 | 3/2014 | Onizawa et al. |
| 8,703,578 B2 | 4/2014 | Hoentschel et al. |
| 8,728,956 B2 | 5/2014 | LaVoie et al. |
| 8,753,984 B2 | 6/2014 | Murakami et al. |
| 8,791,034 B2 | 7/2014 | Shealy et al. |
| 8,846,484 B2 | 9/2014 | Lee et al. |
| 8,936,977 B2 | 1/2015 | Hoentschel et al. |
| 8,975,704 B2 | 3/2015 | Hoentschel et al. |
| 9,023,693 B1 | 5/2015 | Lin et al. |
| 9,023,737 B2 | 5/2015 | Beynet et al. |
| 9,070,555 B2 | 6/2015 | Hausmann et al. |
| 9,095,869 B2 | 8/2015 | Kilpi et al. |
| 9,214,333 B1 | 12/2015 | Sims et al. |
| 9,355,839 B2 | 5/2016 | Swaminathan et al. |
| 9,390,909 B2 | 7/2016 | Pasquale et al. |
| 9,406,693 B1 | 8/2016 | Pang et al. |
| 9,443,731 B1 | 9/2016 | O'Meara et al. |
| 9,472,506 B2 | 10/2016 | Conklin et al. |
| 9,502,238 B2 | 11/2016 | Danek et al. |
| 9,508,604 B1 | 11/2016 | Sung et al. |
| 9,530,663 B1 | 12/2016 | Shih et al. |
| 9,564,312 B2 | 2/2017 | Henri et al. |
| 9,576,817 B1 | 2/2017 | Cheng et al. |
| 9,589,790 B2 | 3/2017 | Henri et al. |
| 9,601,693 B1 | 3/2017 | Henri et al. |
| 9,670,579 B2 | 6/2017 | Hausmann et al. |
| 9,721,784 B2 | 8/2017 | Behera et al. |
| 9,865,815 B2 | 1/2018 | Hausmann et al. |
| 9,875,891 B2 | 1/2018 | Henri et al. |
| 9,892,933 B2 | 2/2018 | Peng et al. |
| 10,074,543 B2 | 9/2018 | Mahorowala et al. |
| 10,134,579 B2 | 11/2018 | Baldasseroni et al. |
| 10,141,505 B2 | 11/2018 | Hausmann et al. |
| 10,269,559 B2 | 4/2019 | Abel et al. |
| 2002/0001889 A1 | 1/2002 | Kim et al. |
| 2002/0001929 A1 | 1/2002 | Biberger et al. |
| 2003/0143841 A1 | 7/2003 | Yang et al. |
| 2004/0043570 A1 | 3/2004 | Fujisaki et al. |
| 2005/0025885 A1 | 2/2005 | McSwiney et al. |
| 2005/0042865 A1 | 2/2005 | Cabral et al. |
| 2005/0100670 A1 | 5/2005 | Dussarrat et al. |
| 2005/0109276 A1 | 5/2005 | Iyer et al. |
| 2005/0118837 A1 | 6/2005 | Todd et al. |
| 2005/0142878 A1* | 6/2005 | Jung ................ H01L 21/31053 438/689 |
| 2005/0158983 A1 | 7/2005 | Hoshi et al. |
| 2005/0159017 A1 | 7/2005 | Kim et al. |
| 2005/0170104 A1 | 8/2005 | Jung et al. |
| 2005/0196977 A1 | 9/2005 | Saito et al. |
| 2005/0227017 A1 | 10/2005 | Senzaki et al. |
| 2005/0287309 A1 | 12/2005 | Veerasamy |
| 2005/0287775 A1 | 12/2005 | Hasebe et al. |
| 2006/0003557 A1 | 1/2006 | Cabral et al. |

(56) References Cited

U.S. PATENT DOCUMENTS

| | | |
|---|---|---|
| 2006/0008656 A1 | 1/2006 | Veerasamy |
| 2006/0032442 A1 | 2/2006 | Hasebe |
| 2006/0084283 A1 | 4/2006 | Paranjpe et al. |
| 2006/0088985 A1 | 4/2006 | Haverkort et al. |
| 2006/0119248 A1* | 6/2006 | Howard .............. B82Y 10/00 |
| | | 313/495 |
| 2006/0199357 A1 | 9/2006 | Wan et al. |
| 2006/0263699 A1* | 11/2006 | Abatchev .......... H01L 21/76816 |
| | | 430/5 |
| 2006/0273456 A1* | 12/2006 | Sant .................. H01L 21/3086 |
| | | 257/734 |
| 2006/0286776 A1 | 12/2006 | Ranish et al. |
| 2006/0289385 A1 | 12/2006 | Kikuchi |
| 2007/0032047 A1 | 2/2007 | Hasebe et al. |
| 2007/0099431 A1* | 5/2007 | Li ........................ H01L 21/3081 |
| | | 438/735 |
| 2007/0137572 A1 | 6/2007 | Matsuura et al. |
| 2007/0148968 A1* | 6/2007 | Kwon .............. H01L 21/0337 |
| | | 438/671 |
| 2007/0167028 A1 | 7/2007 | Chou et al. |
| 2007/0212850 A1* | 9/2007 | Ingle .................... C23C 16/045 |
| | | 438/435 |
| 2007/0218661 A1 | 9/2007 | Shroff et al. |
| 2007/0238299 A1 | 10/2007 | Niroomand et al. |
| 2007/0238316 A1 | 10/2007 | Ohashi |
| 2007/0251444 A1 | 11/2007 | Gros et al. |
| 2007/0298585 A1 | 12/2007 | Lubomirsky et al. |
| 2008/0038936 A1 | 2/2008 | Todd et al. |
| 2008/0063791 A1 | 3/2008 | Hasebe et al. |
| 2008/0081470 A1 | 4/2008 | Clark |
| 2008/0119057 A1 | 5/2008 | Chua et al. |
| 2008/0124946 A1 | 5/2008 | Xiao et al. |
| 2008/0138996 A1 | 6/2008 | Nishizuka |
| 2008/0139003 A1 | 6/2008 | Pirzada et al. |
| 2008/0213479 A1 | 9/2008 | Chou et al. |
| 2008/0237726 A1 | 10/2008 | Dyer |
| 2008/0242116 A1 | 10/2008 | Clark |
| 2008/0260969 A1 | 10/2008 | Dussarrat et al. |
| 2008/0274302 A1 | 11/2008 | Hasebe et al. |
| 2008/0311760 A1 | 12/2008 | Nodera et al. |
| 2008/0318443 A1 | 12/2008 | Kim et al. |
| 2009/0018668 A1 | 1/2009 | Galbraith |
| 2009/0075490 A1 | 3/2009 | Dussarrat |
| 2009/0146322 A1 | 6/2009 | Weling et al. |
| 2009/0148625 A1 | 6/2009 | Yeom et al. |
| 2009/0155606 A1 | 6/2009 | Yoon et al. |
| 2009/0163041 A1 | 6/2009 | Mungekar et al. |
| 2009/0191722 A1 | 7/2009 | Hasebe et al. |
| 2009/0286381 A1 | 11/2009 | van Schravendijk et al. |
| 2010/0003797 A1 | 1/2010 | Smith |
| 2010/0038727 A1 | 2/2010 | Chakravarthi et al. |
| 2010/0099271 A1 | 4/2010 | Hausmann et al. |
| 2010/0102407 A1 | 4/2010 | Kajiyama et al. |
| 2010/0124618 A1 | 5/2010 | Kobayashi et al. |
| 2010/0124621 A1 | 5/2010 | Kobayashi et al. |
| 2010/0136260 A1 | 6/2010 | Matsunaga et al. |
| 2010/0136313 A1 | 6/2010 | Shimizu et al. |
| 2010/0151681 A1 | 6/2010 | Knapp et al. |
| 2010/0221925 A1 | 9/2010 | Lee et al. |
| 2010/0267238 A1* | 10/2010 | Johnson .............. H01L 21/3086 |
| | | 438/692 |
| 2010/0304047 A1 | 12/2010 | Yang et al. |
| 2010/0304574 A1 | 12/2010 | Nodera et al. |
| 2010/0310791 A1 | 12/2010 | Shimazu et al. |
| 2011/0003477 A1 | 1/2011 | Park et al. |
| 2011/0014795 A1 | 1/2011 | Lee et al. |
| 2011/0021010 A1 | 1/2011 | Cheng et al. |
| 2011/0086516 A1 | 4/2011 | Lee et al. |
| 2011/0127582 A1 | 6/2011 | Cheng et al. |
| 2011/0129978 A1 | 6/2011 | Cheng et al. |
| 2011/0151142 A1 | 6/2011 | Seamons et al. |
| 2011/0176967 A1 | 7/2011 | Okuda et al. |
| 2011/0183528 A1 | 7/2011 | Wang et al. |
| 2011/0244142 A1 | 10/2011 | Cheng et al. |
| 2011/0256734 A1 | 10/2011 | Hausmann et al. |
| 2012/0009802 A1 | 1/2012 | LaVoie et al. |
| 2012/0009803 A1 | 1/2012 | Jung et al. |
| 2012/0028469 A1 | 2/2012 | Onizawa et al. |
| 2012/0058282 A1 | 3/2012 | Hong et al. |
| 2012/0068347 A1* | 3/2012 | Isobayashi .......... H01L 21/0332 |
| | | 257/773 |
| 2012/0104347 A1 | 5/2012 | Quick |
| 2012/0108079 A1 | 5/2012 | Mahajani |
| 2012/0115074 A1* | 5/2012 | Zhang ................ H01L 21/02115 |
| | | 430/5 |
| 2012/0142194 A1 | 6/2012 | Hwang |
| 2012/0156882 A1 | 6/2012 | Lee et al. |
| 2012/0156888 A1 | 6/2012 | Sato et al. |
| 2012/0164846 A1 | 6/2012 | Ha et al. |
| 2012/0171846 A1* | 7/2012 | Hwang ................ H01L 21/743 |
| | | 438/478 |
| 2012/0177841 A1 | 7/2012 | Thompson |
| 2012/0213940 A1 | 8/2012 | Mallick |
| 2012/0244711 A1* | 9/2012 | Yin ...................... H01L 21/0337 |
| | | 438/703 |
| 2012/0264305 A1 | 10/2012 | Nakano |
| 2012/0282418 A1 | 11/2012 | Chou et al. |
| 2012/0315394 A1 | 12/2012 | Ito |
| 2013/0071580 A1 | 3/2013 | Weidman et al. |
| 2013/0084688 A1* | 4/2013 | O'Meara ............ H01L 21/0337 |
| | | 438/478 |
| 2013/0113073 A1 | 5/2013 | Liu et al. |
| 2013/0115783 A1 | 5/2013 | Kim et al. |
| 2013/0189845 A1 | 7/2013 | Kim et al. |
| 2013/0189854 A1 | 7/2013 | Hausmann et al. |
| 2013/0210236 A1 | 8/2013 | Ogihara et al. |
| 2013/0252437 A1 | 9/2013 | Sano et al. |
| 2013/0327636 A1 | 12/2013 | Majetich et al. |
| 2013/0344248 A1 | 12/2013 | Clark |
| 2014/0023794 A1 | 1/2014 | Mahajani et al. |
| 2014/0113455 A1 | 4/2014 | Reimer et al. |
| 2014/0113457 A1 | 4/2014 | Sims et al. |
| 2014/0120737 A1 | 5/2014 | Swaminathan et al. |
| 2014/0134812 A1 | 5/2014 | Kim et al. |
| 2014/0141625 A1 | 5/2014 | Fukazawa et al. |
| 2014/0141626 A1 | 5/2014 | Hausmann et al. |
| 2014/0170853 A1 | 6/2014 | Shamma et al. |
| 2014/0193983 A1 | 7/2014 | LaVoie |
| 2014/0216337 A1 | 8/2014 | Swaminathan et al. |
| 2014/0262038 A1 | 9/2014 | Wang et al. |
| 2014/0273477 A1 | 9/2014 | Niskanen et al. |
| 2014/0273528 A1 | 9/2014 | Niskanen et al. |
| 2014/0273529 A1 | 9/2014 | Nguyen et al. |
| 2014/0273530 A1 | 9/2014 | Nguyen et al. |
| 2014/0273531 A1 | 9/2014 | Niskanen et al. |
| 2014/0302686 A1 | 10/2014 | Pan et al. |
| 2015/0021712 A1 | 1/2015 | Zschaetzsch et al. |
| 2015/0031218 A1 | 1/2015 | Karakawa |
| 2015/0056540 A1 | 2/2015 | Fukuda |
| 2015/0126042 A1 | 5/2015 | Pasquale et al. |
| 2015/0132965 A1 | 5/2015 | deVilliers et al. |
| 2015/0137061 A1 | 5/2015 | Donghi et al. |
| 2015/0155198 A1* | 6/2015 | Tsai .................. H01L 21/76802 |
| | | 438/674 |
| 2015/0162416 A1* | 6/2015 | Chang ................ H01L 29/6656 |
| | | 257/288 |
| 2015/0200110 A1* | 7/2015 | Li ...................... H01L 21/31144 |
| | | 438/696 |
| 2015/0243708 A1 | 8/2015 | Ravasio et al. |
| 2015/0249153 A1* | 9/2015 | Morin .................. H01L 29/785 |
| | | 257/192 |
| 2015/0251917 A1* | 9/2015 | Hong .................. B81C 1/00031 |
| | | 216/24 |
| 2015/0259791 A1 | 9/2015 | Hausmann et al. |
| 2016/0020092 A1 | 1/2016 | Kang et al. |
| 2016/0042950 A1* | 2/2016 | Dai .................... H01L 21/0337 |
| | | 438/703 |
| 2016/0046501 A1 | 2/2016 | Kverel et al. |
| 2016/0049307 A1 | 2/2016 | Chen |
| 2016/0064224 A1* | 3/2016 | Hung .............. H01L 21/28132 |
| | | 438/595 |
| 2016/0079054 A1 | 3/2016 | Chen et al. |

(56) References Cited

U.S. PATENT DOCUMENTS

| | | | |
|---|---|---|---|
| 2016/0093484 A1 | 3/2016 | Marsh | |
| 2016/0099143 A1 | 4/2016 | Yan et al. | |
| 2016/0109804 A1* | 4/2016 | Huli | G03F 7/40 430/325 |
| 2016/0148800 A1 | 5/2016 | Henri et al. | |
| 2016/0148806 A1 | 5/2016 | Henri et al. | |
| 2016/0155739 A1 | 6/2016 | Ting et al. | |
| 2016/0172194 A1 | 6/2016 | Kunnen et al. | |
| 2016/0225640 A1* | 8/2016 | Raley | H01L 21/31144 |
| 2016/0247678 A1* | 8/2016 | Feng | H01L 21/0337 |
| 2016/0247680 A1 | 8/2016 | O'Meara et al. | |
| 2016/0284567 A1 | 9/2016 | Reilly et al. | |
| 2016/0293398 A1 | 10/2016 | Danek et al. | |
| 2016/0293418 A1 | 10/2016 | Pasquale et al. | |
| 2016/0300718 A1 | 10/2016 | Raley et al. | |
| 2016/0336178 A1 | 11/2016 | Swaminathan et al. | |
| 2016/0336187 A1* | 11/2016 | Liou | H01L 21/3086 |
| 2016/0365425 A1* | 12/2016 | Chen | H01L 29/6653 |
| 2016/0372334 A1* | 12/2016 | Mignot | H01L 21/31116 |
| 2017/0069510 A1 | 3/2017 | Kal et al. | |
| 2017/0092496 A1* | 3/2017 | deVilliers | H01L 21/0337 |
| 2017/0092857 A1 | 3/2017 | Hausmann et al. | |
| 2017/0110550 A1 | 4/2017 | Tsai et al. | |
| 2017/0117134 A1 | 4/2017 | Henri et al. | |
| 2017/0148637 A1 | 5/2017 | deVilliers | |
| 2017/0170015 A1 | 6/2017 | Kim et al. | |
| 2017/0170026 A1 | 6/2017 | Hudson et al. | |
| 2017/0323785 A1 | 11/2017 | Singhal et al. | |
| 2018/0005814 A1 | 1/2018 | Kumar et al. | |
| 2018/0033622 A1 | 2/2018 | Swaminathan et al. | |
| 2018/0061628 A1 | 3/2018 | Ou et al. | |
| 2018/0061650 A1 | 3/2018 | Mahorowala | |
| 2018/0114903 A1 | 4/2018 | Hausmann | |
| 2018/0138028 A1 | 5/2018 | Henri et al. | |
| 2018/0138036 A1 | 5/2018 | Baldasseroni et al. | |
| 2018/0138405 A1 | 5/2018 | McKerrow et al. | |
| 2019/0080903 A1 | 3/2019 | Abel et al. | |
| 2019/0206677 A1 | 7/2019 | Abel et al. | |

FOREIGN PATENT DOCUMENTS

| | | |
|---|---|---|
| CN | 101006195 A | 7/2007 |
| CN | 101255548 A | 9/2008 |
| CN | 101328578 A | 12/2008 |
| CN | 101378007 A | 3/2009 |
| CN | 102471885 A | 5/2012 |
| CN | 103225071 A | 7/2013 |
| CN | 103515197 A | 1/2014 |
| CN | 104046955 A | 9/2014 |
| EP | 0 277 766 | 8/1988 |
| EP | 2 278 046 A1 | 1/2011 |
| GB | 1 181 559 | 2/1970 |
| JP | 2005-210076 A | 8/2005 |
| JP | 2006-060091 | 3/2006 |
| JP | 2007-281181 A | 10/2007 |
| JP | 2008-517479 | 5/2008 |
| JP | 2009-170823 A | 7/2009 |
| JP | 2010-10497 | 1/2010 |
| JP | 2010-527138 A | 8/2010 |
| JP | 2010-283388 A | 12/2010 |
| JP | 2011-192776 A | 9/2011 |
| JP | 2012-142574 A | 7/2012 |
| JP | 2013225655 | 10/2013 |
| JP | 2014-532304 A | 12/2014 |
| KR | 10-2009-0080019 | 7/2009 |
| KR | 10-2015-0025224 | 3/2015 |
| TW | 2010-33739 A | 9/2010 |
| TW | 2016-06855 A | 2/2016 |
| WO | WO 2006/018441 | 2/2006 |
| WO | WO 2006/026350 | 3/2006 |
| WO | WO 2011/130397 | 10/2011 |
| WO | WO 2013/043330 | 3/2013 |
| WO | WO 2013/066667 | 5/2013 |

OTHER PUBLICATIONS

U.S. Office Action dated Oct. 1, 2015 issued in U.S. Appl. No. 14/552,245.
U.S. Notice of Allowance dated Feb. 1, 2016 issued in U.S. Appl. No. 14/552,245.
U.S. Office Action dated May 24, 2016 issued in U.S. Appl. No. 14/552,245.
U.S. Notice of Allowance dated Oct. 26, 2016 issued in U.S. Appl. No. 14/552,245.
U.S. Office Action dated May 25, 2016 issued in U.S. Appl. No. 14/552,011.
U.S. Notice of Allowance dated Sep. 26, 2016 issued in U.S. Appl. No. 14/552,011.
U.S. Notice of Allowance dated Sep. 28, 2017 issued in U.S. Appl. No. 15/399,637.
U.S. Notice of Allowance dated Jul. 15, 2016 issued in U.S. Appl. No. 14/678,736.
U.S. Office Action dated Apr. 18, 2016 issued in U.S. Appl. No. 14/935,317.
U.S. Notice of Allowance dated Sep. 19, 2016 issued in U.S. Appl. No. 14/935,317.
U.S. Office Action dated May 19, 2017 issued in U.S. Appl. No. 15/272,222.
U.S. Notice of Allowance dated Sep. 1, 2017 issued in U.S. Appl. No. 15/272,222.
U.S. Office Action dated Sep. 14, 2012 issued in U.S. Appl. No. 13/084,305.
U.S. Final Office Action dated Apr. 25, 2013 issued in U.S. Appl. No. 13/084,305.
U.S. Office Action dated Jun. 7, 2013 issued U.S. Appl. No. 13/414,619.
U.S. Notice of Allowance dated Jul. 26, 2013, issued U.S. Appl. No. 13/414,619.
U.S. Office Action dated Apr. 11, 2014 issued in U.S. Appl. No. 14/065,334.
U.S. Final Office Action dated Nov. 14, 2014 issued in U.S. Appl. No. 14/065,334.
U.S. Notice of Allowance dated Feb. 17, 2015 issued in U.S. Appl. No. 14/065,334.
U.S. Notice of Allowance dated Feb. 8, 2017 issued in U.S. Appl. No. 14/713,639.
PCT Invitation to Pay Additional Fees; Communication Re Partial International Search, dated Dec. 16, 2010, issued in PCT/US2011/032303.
PCT International Search Report and Written Opinion, dated Feb. 20, 2012, issued in PCT/US2011/032303.
PCT International Preliminary Report on Patentability and Written Opinion, dated Oct. 26, 2012, issued in PCT/US2011/032303.
Chinese First Office Action dated May 19, 2016 issued in CN 201310021460.8.
Chinese Second Office Action dated Apr. 13, 2017 issued in CN 201310021460.8.
European Extended Search Report dated Apr. 14, 2014 issued in EP 13 152 046.2.
Japanese Office Action dated Jan. 10, 2017 issued in JP 2013-007612.
Korean Notice of Provisional Rejection dated Dec. 6, 2013 issued in KR 10-2012-0043797.
Korean Final Office Action dated Aug. 18, 2014 issued in KR 10-2012-0043797.
Korean Decision from the Patent Tribunal of the KIPO [description] dated May 26, 2015 issued in KR 10-2012-0043797.
Taiwan Examination Report dated Mar. 29, 2017 issued in TW 102102054.
Aboaf, J.A. (1969) "Some Properties of Vapor Deposited Silicon Nitride Films Obtained by the Reaction of SiBr4 and NH 3," *Journal of the Electrochemical Society*, 116(12):1736-1740.
Becker, F.S. and Rohl, S. (Nov. 1987) "Low Pressure Deposition of Doped $SiO_2$ by Pyrolysis of Tetraethylorthosilicate (TEOS)," *J. Electrochem. Soc.: Solid-State Science and Technology*, 134(11):2923-2931.

(56) References Cited

OTHER PUBLICATIONS

Cecchi et al., (2007) "Ultra-thin conformal pore-sealing of low-k materials by plasma-assisted ALD," *University of New Mexico, Albuquerque, NM, Sandia National Labs, Albuquerque, NM*, 1 page.
King, Sean W., (Jul./Aug. 2011) "Plasma enhanced atomic layer deposition of $SiN_x$:H and $SiO_2$," *J. Vac. Sci. Technol.* A29(4):041501-1 through 041501-9 (9 pages).
Kunnen et al., (2015) "A way to integrate multiple block layers for middle of line contact patterning," *Proc. of SPIE*, 9428:94280W1-8 [Downloaded on Jun. 27, 2017 from http://proceedings.spiedigitallibrary.org].
Lin et al., (1998) "Silicon Nitride Films Deposited by Atmospheric Pressure Chemical Vapor Deposition," *Materials Research Society Symposium Proceedings Volume 495, Chemical Aspects of Electronic Ceramics Processing, Symposium held Nov. 30-Dec. 4, 1997, Boston, Massachusetts, U.S.A.*, 8 pages.
Plasma Enhanced Atomic Layer Deposition (PEALD), Website: http://www.asm.com/index.php?option=com_content&task=view&id=19&Itemid=16 1 (2010), 1 page.
"PlasmaPro™ NGP® 80 Range," Oxford Instruments (2010), 8 pages.
U.S. Appl. No. 15/201,221, filed Jul. 1, 2016, Kumar et al.
U.S. Appl. No. 15/253,301, filed Aug. 31, 2016, Ou et al.
U.S. Appl. No. 15/253,546, filed Aug. 31, 2016, Mahorowala et al.
U.S. Appl. No. 15/258,789, filed Sep. 7, 2016, Sims et al.
U.S. Appl. No. 15/279,314, filed Sep. 28, 2016, Singhal et al.
U.S. Appl. No. 15/279,312, filed Sep. 28, 2016, Swaminathan et al.
U.S. Appl. No. 15/349,753, filed Nov. 11, 2016, McKerrow et al.
U.S. Appl. No. 15/351,221, filed Nov. 14, 2016, Baldasseroni et al.
U.S. Office Action dated Apr. 7, 2017 issued in U.S. Appl. No. 15/279,314.
U.S. Office Action dated Oct. 6, 2017 issued in U.S. Appl. No. 15/253,546.
U.S. Office Action dated Jun. 29, 2017 issued in U.S. Appl. No. 15/279,312.
U.S. Office Action dated Mar. 10, 2017 issued in U.S. Appl. No. 15/258,789.
U.S. Final Office Action dated Jul. 14, 2017 issued in U.S. Appl. No. 15/258,789.
U.S. Notice of Allowance dated Aug. 30, 2017 issued in U.S. Appl. No. 15/258,789.
U.S. Office Action dated Jul. 5, 2017 issued in U.S. Appl. No. 15/351,221.
U.S. Final Office Action dated Oct. 19, 2017 issued in U.S. Appl. No. 15/279,314.
U.S. Notice of Allowance dated Apr. 25, 2018 issued in U.S. Appl. No. 15/253,546.
U.S. Final Office Action dated Apr. 9, 2018 issued in U.S. Appl. No. 15/279,312.
Chinese First Office Action dated Nov. 8, 2017 issued in Application No. CN 201510615853.0.
Chinese Third Office Action dated Oct. 17, 2017 issued in Application No. CN 201310021460.8.
European Examination Report dated Dec. 11, 2017 issued in Application No. EP 13 15 2046.
Japanese Second Office Action [Decision of Rejection] dated Jan. 9, 2018 issued in Application No. JP 2013-007612.
PCT International Search Report and Written Opinion dated Feb. 13, 2018 issued in Application No. PCT/US2017/060692.
PCT International Search Report and Written Opinion dated Feb. 21, 2018 issued in Application No. PCT/US2017/060240.
Chinese First Office Action dated Mar. 30, 2018 issued in Application No. CN 201610206201.6.
Huang et al. (2017) "Design of efficient mono-aminosilane precursors for atomic layer deposition of $SiO_2$ thin films," *Royal Society of Chemistry Adv*2017, 7:22672-22678.
*Wikipedia, The Free Encyclopedia*, Definition of "Silicon Nitride," Archived from Apr. 9, 2015, 1 page [Downloaded on Oct. 12, 2017 from https://web.archive.org/web/20150409055521/https://en.wikipedia.org/wiki/Silicon_nitride].
U.S. Appl. No. 15/703,917, filed Sep. 13, 2017, Abel et al.
U.S. Appl. No. 15/847,744, filed Dec. 19, 2017, Henri et al.
Preliminary Amendment filed on Feb. 1, 2018 in U.S. Appl. No. 15/847,744.
U.S. Final Office Action dated Jan. 2, 2018 issued in U.S. Appl. No. 15/351,221.
U.S. Office Action dated Oct. 23, 2017 issued in U.S. Appl. No. 15/349,753.
U.S. Final Office Action dated Apr. 20, 2018 issued in U.S. Appl. No. 15/349,753.
U.S. Notice of Allowance dated Jul. 26, 2018 issued in U.S. Appl. No. 15/829,702.
U.S. Notice of Allowance dated Jul. 16, 2018 issued in U.S. Appl. No. 15/351,221.
U.S. Office Action dated Sep. 28, 2018 issued in U.S. Appl. No. 15/349,753.
Chinese Fourth Office Action dated May 16, 2018 issued in Application No. CN 201310021460.8.
U.S. Office Action dated Jul. 18, 2018 issued in U.S. Appl. No. 15/703,917.
U.S. Office Action dated Apr. 18, 2019 issued in U.S. Appl. No. 15/279,312.
U.S. Notice of Allowance dated Dec. 5, 2018 issued in U.S. Appl. No. 15/703,917.
Taiwanese First Office Action dated Apr. 25, 2019 issued in Application No. TW 104131344.
Japanese Third Office Action [Reasons for Refusal] dated Apr. 2, 2019 issued in Application No. JP 2013-007612.
Taiwan First Office Action dated Feb. 27, 2019, issued in Application No. TW 106124691.
PCT International Search Report and Written Opinion dated Feb. 25, 2019 issued in Application No. PCT/US2018/050049.
Chinese Second Office Action dated Jan. 24, 2019 issued in Application No. CN 201610206201.6.
U.S. Appl. No. 16/294,783, filed Mar. 6, 2019, Abel et al.
U.S. Office Action dated Jul. 30, 2019 issued in U.S. Appl. No. 15/847,744.
U.S. Notice of Allowance dated Jun. 17, 2019 issued in U.S. Appl. No. 15/349,753.
Taiwanese First Office Action dated Jun. 13, 2019 issued in Application No. TW 104138370.
Japanese First Office Action dated May 28, 2019 issued in Application No. JP 2017143195.
International Preliminary Report on Patentability dated May 23, 2019 issued in Application No. PCT/US17/60692.
International Preliminary Report on Patentability dated May 23, 2019 issued in Application No. PCT/US17/60240.
Japanese First Office Action [Reasons for Refusal] dated May 29, 2019 issued in Application No. JP 2018-090402.

\* cited by examiner

SELF-ALIGNED MULTI-PATTERNING PROCESS FLOW WITH ALD GAPFILL SPACER MASK

BACKGROUND

Fabrication of advanced integrated circuits often involves patterning of small features in high volume manufacturing of semiconductors. Multiple patterning techniques may enable feature size scaling based on lithographic techniques such as 193 nm immersion lithography. Self-aligned double patterning is an example of a multiple patterning technique.

SUMMARY

Provided herein are methods of processing substrates, such as semiconductor substrates. One aspect involves a method of processing a substrate, the method including: providing the substrate having a core material patterned to form gaps and a target layer; depositing gapfill material conformally over the core material such that gapfill material is deposited in the gaps on the substrate; planarizing the substrate to form a planar surface including the gapfill material and the core material; and selectively etching the core material to form symmetrically shaped spacers used as a mask to etch the target layer.

In various embodiments, the gapfill material is deposited by atomic layer deposition. In some embodiments, the gapfill material is deposited by atomic layer deposition for a duration insufficient to completely fill the gaps.

In some embodiments, the gaps have openings less than about x nm and the gapfill material is deposited for a duration sufficient to deposit the gapfill material to a thickness between about 0.4×x nm and about 0.5×x nm. In some embodiments, x is 50. In some embodiments, x is less than 50.

In some embodiments, the gapfill material is any one of silicon oxide, silicon nitride, silicon carbide, and titanium oxide.

In some embodiments, the critical dimension between symmetrically shaped spacers in the mask is less than about 50 nm. The symmetrically shaped spacers may be used for multiple patterning techniques. In some embodiments, depositing the gapfill material and planarizing the substrate reduces pitch walking. In various embodiments, the symmetrically shaped spacers include the gapfill material.

The method may also include prior to depositing the gapfill material, depositing another conformal film over the substrate and directionally etching the another conformal film to form sidewall spacers on the sidewalls of the core material. In various embodiments, selectively etching the substrate to form the symmetrically shaped spacers includes removing the core material and the gapfill material selective to the sidewall spacers. Selectively etching the substrate to form the symmetrically shaped spacers may include removing the core material selective to the gapfill material.

In various embodiments, the core material includes carbon. The core material may be any of spin on carbon, diamond-like carbon, and/or gapfill ashable hard mask.

In various embodiments, depositing the gapfill material includes exposing the substrate to alternating pulses of a silicon-containing precursor and an oxidizing plasma.

Another aspect involves a method including: providing a substrate including spacers forming a mask, each spacer including sidewalls perpendicular to the top surface of the spacer, the spacers formed by depositing gapfill material conformally in gaps of a core material, planarizing the gapfill material and the core material to form a planar surface, and selectively removing the core material; and etching a target layer using the spacers as the mask. In various embodiments, the mask has a pitch less than about 50 nm.

In various embodiments, the gapfill material is deposited by atomic layer deposition. In some embodiments, the gapfill material is deposited by atomic layer deposition for a duration insufficient to completely fill the gaps.

In some embodiments, the gapfill material is selected from the group consisting of silicon oxide, silicon nitride, silicon carbide, and titanium oxide.

The symmetrically shaped spacers may be used for multiple patterning techniques. In some embodiments, depositing the gapfill material and planarizing the substrate reduces pitch walking. In various embodiments, the symmetrically shaped spacers include the gapfill material.

In various embodiments, the core material includes carbon. The core material may be any of spin on carbon, diamond-like carbon, and/or gapfill ashable hard mask.

In various embodiments, depositing the gapfill material includes exposing the substrate to alternating pulses of a silicon-containing precursor and an oxidizing plasma.

Another aspect involves a method including: providing a substrate including spacers forming a mask, each spacer including sidewalls meeting the top surface of the spacer at an angle of 90°±5°, the spacers formed by depositing gapfill material conformally in gaps of a core material, planarizing the gapfill material and the core material to form a planar surface, and selectively removing the core material; and etching a target layer using the spacers as the mask.

In various embodiments, the gapfill material is deposited by atomic layer deposition. In some embodiments, the gapfill material is deposited by atomic layer deposition for a duration insufficient to completely fill the gaps.

In some embodiments, the gapfill material is any of silicon oxide, silicon nitride, silicon carbide, and titanium oxide.

The symmetrically shaped spacers may be used for multiple patterning techniques. In some embodiments, depositing the gapfill material and planarizing the substrate reduces pitch walking. In various embodiments, the symmetrically shaped spacers include the gapfill material.

In various embodiments, the core material includes carbon. The core material may be any of spin on carbon, diamond-like carbon, and/or gapfill ashable hard mask.

In various embodiments, depositing the gapfill material includes exposing the substrate to alternating pulses of a silicon-containing precursor and an oxidizing plasma.

Another aspect involves an apparatus for patterning substrates, the apparatus including: one or more process chambers; one or more gas inlets into the one or more process chambers and associated flow control hardware; a low frequency radio frequency (LFRF) generator; a high frequency radio frequency (HFRF) generator; and a controller having at least one processor and a memory, whereby the at least one processor and the memory are communicatively connected with one another, the at least one processor is at least operatively connected with the flow-control hardware, the LFRF generator, and the HFRF generator, and the memory stores computer-executable instructions for controlling the at least one processor to at least control the flow-control hardware, the HFRF generator, and the LFRF generator to: introduce gapfill material precursors to deposit gapfill material conformally over a core material of a substrate including a target layer, the core material patterned to form gaps, such that gapfill material is deposited in the gaps on the substrate; planarize the substrate to form a planar surface including the gapfill material and the core material; and selectively etch the core material to form symmetrically shaped spacers used as a mask to etch the target layer.

Another aspect involves an apparatus for patterning substrates, the apparatus including: one or more process chambers; one or more gas inlets into the one or more process chambers and associated flow control hardware; a low frequency radio frequency (LFRF) generator; a high frequency radio frequency (HFRF) generator; and a controller having at least one processor and a memory, whereby the at least one processor and the memory are communicatively connected with one another, the at least one processor is at least operatively connected with the flow-control hardware, the LFRF generator, and the HFRF generator, and the memory stores computer-executable instructions for controlling the at least one processor to at least control the flow-control hardware, the HFRF generator, and the LFRF generator to: transfer a substrate into the one or more process chambers, the substrate including spacers forming a mask, each spacer including sidewalls perpendicular to the top surface of the spacer, the spacers formed by depositing gapfill material conformally in gaps of a core material; planarizing the gapfill material and the core material to form a planar surface, and selectively removing the core material; and etch a target layer using the spacers as the mask. In various embodiments, the mask has a pitch less than about 50 nm.

Another aspect involves an apparatus for patterning substrates, the apparatus including: one or more process chambers; one or more gas inlets into the one or more process chambers and associated flow control hardware; a low frequency radio frequency (LFRF) generator; a high frequency radio frequency (HFRF) generator; and a controller having at least one processor and a memory, whereby the at least one processor and the memory are communicatively connected with one another, the at least one processor is at least operatively connected with the flow-control hardware, the LFRF generator, and the HFRF generator, and the memory stores computer-executable instructions for controlling the at least one processor to at least control the flow-control hardware, the HFRF generator, and the LFRF generator to: transfer a substrate into the one or more process chambers, the substrate including spacers forming a mask, each spacer including sidewalls meeting the top surface of the spacer at an angle of 90°±5°, the spacers formed by depositing gapfill material conformally in gaps of a core material, planarizing the gapfill material and the core material to form a planar surface, and selectively removing the core material; and etch a target layer using the spacers as the mask.

These and other aspects are described further below with reference to the drawings.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Patterning methods are used in many semiconductor manufacturing processes. In particular, multiple patterning has been used to extend lithographic technology beyond its optical limits. Double patterning and quad patterning are example technologies used to extend lithographic technology beyond its optical limits and double patterning is now widely used in the industry for pitches less than about 80 nm. Current double patterning technologies often use sidewall spacers with two masking steps to pattern trenches. Methods of double patterning, particularly line patterning, in both positive and negative double patterning processes have involved the use of spacers and masks. Spacers can be deposited by plasma enhanced atomic layer deposition (PEALD) on a patterned core and may be used to create a smaller pitch pattern. As devices shrink and the pitch decreases, issues such as spacer leaning, line bending, and patterned spacer collapse arise, which can thereby cause device failure. In particular, pitch walking due to spacer leaning is observed when the core layer is baked and removed.

Figure 1A:
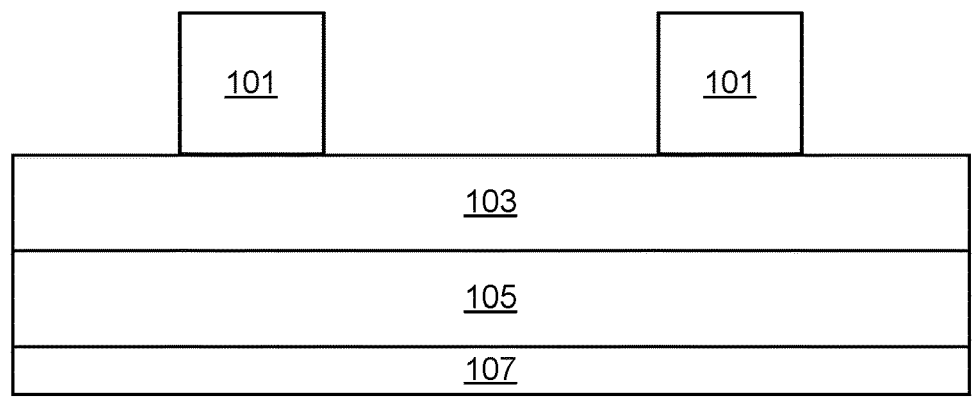
FIGS. 1A-1J are schematic illustrations of substrates in an example of a quad patterning scheme.

FIGS. 1A-1J are example schematic illustrations of a substrate in a quad patterning scheme resulting in pitch walking. FIG. 1A shows a substrate having a lithographically defined or patterned first core 101 on a second core 103, target layer 105, and underlayer 107. One of ordinary skill in the art will appreciate that a multi-layer stack suitable for semiconductor processing as described herein may also include other layers, such as etch stop layers, cap layers, and other underlayers.

The patterned first core 101 may be a photoresist or may include amorphous carbon or amorphous silicon material. The patterned first core 101 may be deposited over the second core 103 by any suitable deposition technique, such as plasma enhanced chemical vapor deposition (PECVD), and the deposition technique may involve generating a plasma in the deposition chamber from deposition gases including a hydrocarbon precursor. The hydrocarbon precursor may be defined by the formula $C_xH_y$, where x is an integer between 2 and 10, and y is an integer between 2 and 24. Examples include methane ($CH_4$), acetylene ($C_2H_2$), ethylene ($C_2H_4$), propylene ($C_3H_6$), butane ($C_4H_{10}$), cyclohexane ($C_6H_{12}$), benzene ($C_6H_6$), and toluene ($C_7H_8$). A dual radio frequency (RF) plasma source including a high frequency (HF) power and a low frequency (LF) power may be used.

Under the second core 103 is the target layer 105. The target layer 105 may be the layer ultimately to be patterned. The target layer 105 may be a semiconductor, dielectric, or other layer and may be made of silicon (Si), silicon oxide ($SiO_2$), silicon nitride (SiN), or titanium nitride (TiN), for example. The target layer 105 may be deposited by atomic layer deposition (ALD), PEALD, chemical vapor deposition (CVD), or other suitable deposition technique.

Figure 1B:
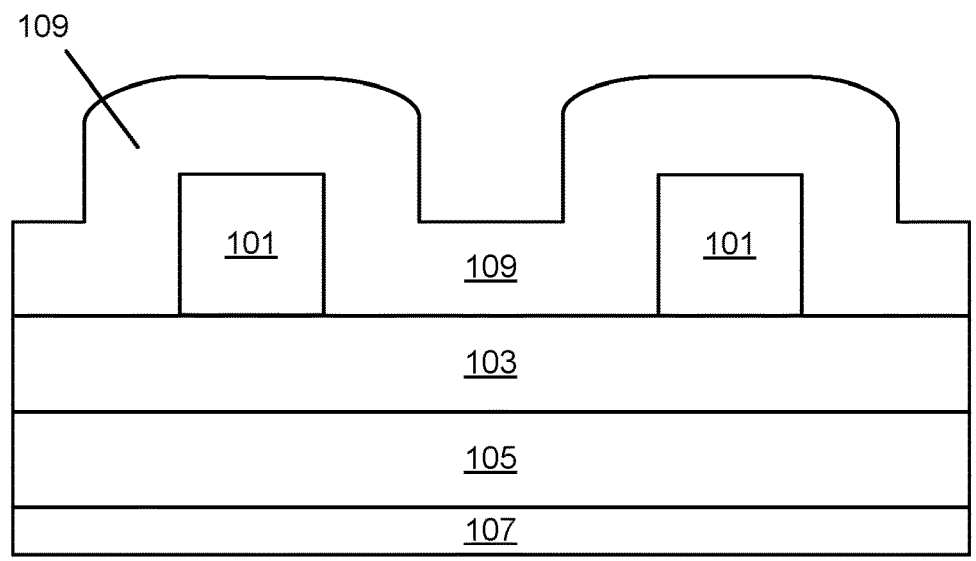
Figure 1C:
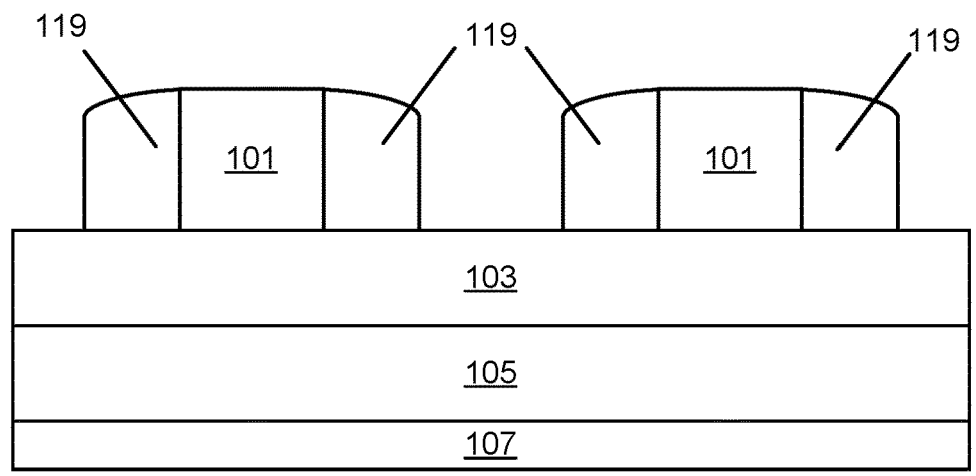

In FIG. 1B, a first conformal film 109 is deposited over the patterned first core 101. The first conformal film 109 may be deposited by ALD or PEALD in some embodiments. The first conformal film 109 is directionally etched to form first spacer 119 as shown in FIG. 1C. The first spacer 119 may be an oxide, such as silicon oxide ($SiO_2$) or titanium oxide ($TiO_2$), or may be a nitride, such as silicon nitride (SiN). The pattern of the first spacer 119 is used to pattern subsequent layers. It will be understood that the term "spacer" as used herein means a mask material adjacent to a core material.

Figure 1D:
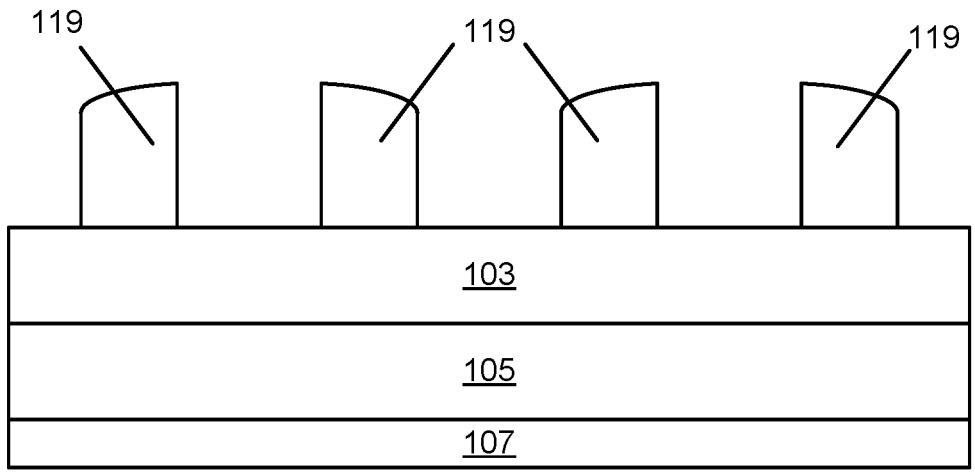

In FIG. 1D, the patterned first core 101 is selectively etched, leaving free-standing first spacers 119 on the substrate. Selective removal or selective etching as used herein is defined as etching one material selective to another. For example, in FIG. 1D, the patterned first core is etched selective to the first spacers 119. It will be understood that in some embodiments, if a first material is etched selective to a second material, the etch rate of the first material is faster than the etch rate of the second material such that for a given duration, more of the first material is etched than the second material.

The pattern of the first spacers 119 may have a pitch of about 50 nm. Since the critical dimension is fairly large, there is little risk of pitch walking at these larger critical dimensions.

Figure 1E:
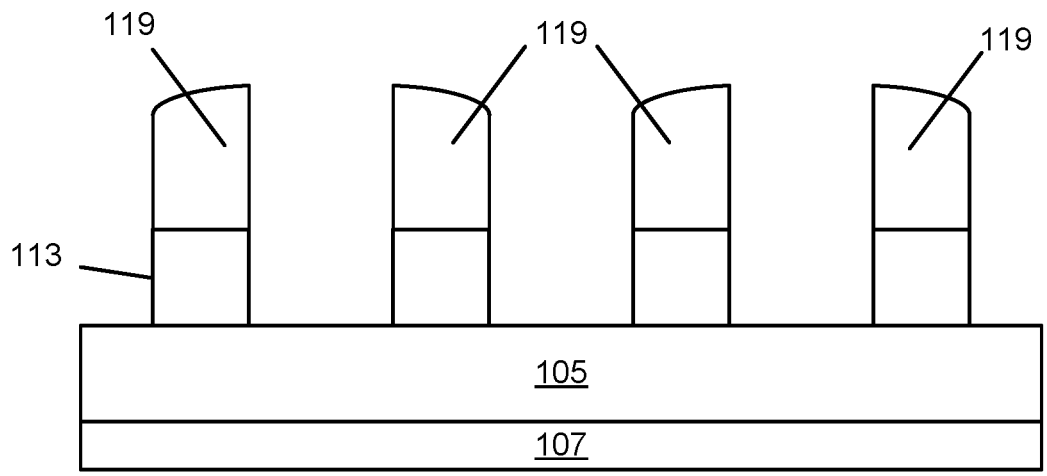

In FIG. 1E, the second core layer 103 is etched using the patterned spacers 119 as a mask, thereby transferring the pattern to the second core layer 103 to form patterned second core 113. The patterned second core 113 may be etched using a chemistry suitable for etching the second core layer 103 but not the patterned spacers 119. The patterned second core 113 may be an amorphous carbon layer, amorphous silicon layer, or a photoresist, such as poly(methyl methacrylate) or poly(methyl glutarimide) (PMGI) or phenol formaldehyde resin.

Figure 1F:
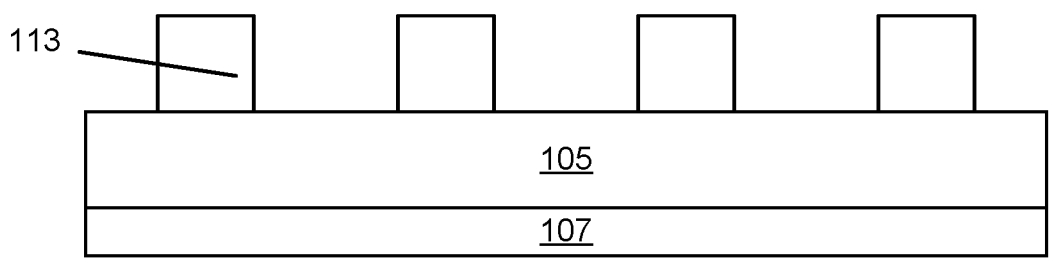

In FIG. 1F, the first spacer 119 is selectively removed to leave patterned second core 113. In one example, the spacer may be removed by flowing $CHF_3$ and/or $CF_4$.

Figure 1G:
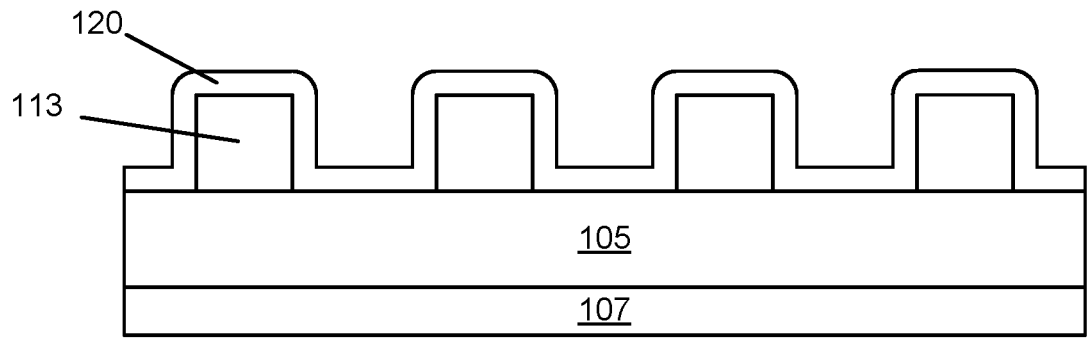

In FIG. 1G, a second conformal film 120 is deposited over the patterned second core 113. The second conformal film 120 may be a dielectric material deposited by ALD or PEALD. For example, in some embodiments, the second conformal film 120 may be silicon oxide. In some embodiments, the second conformal film 120 may have the same or similar composition to that of first conformal film 109.

Figure 1H:
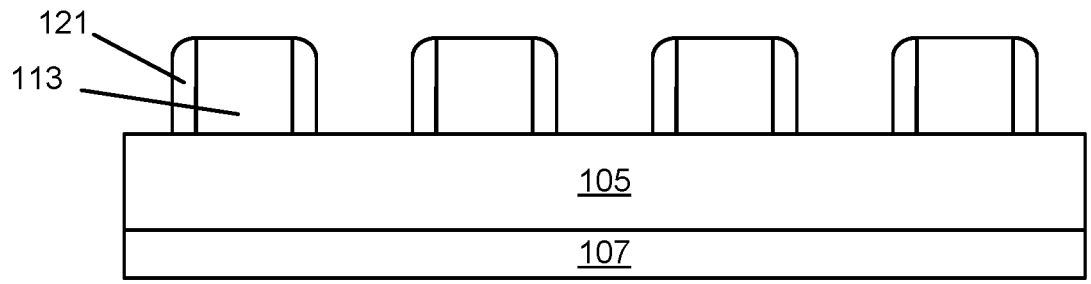
Figure 1I:
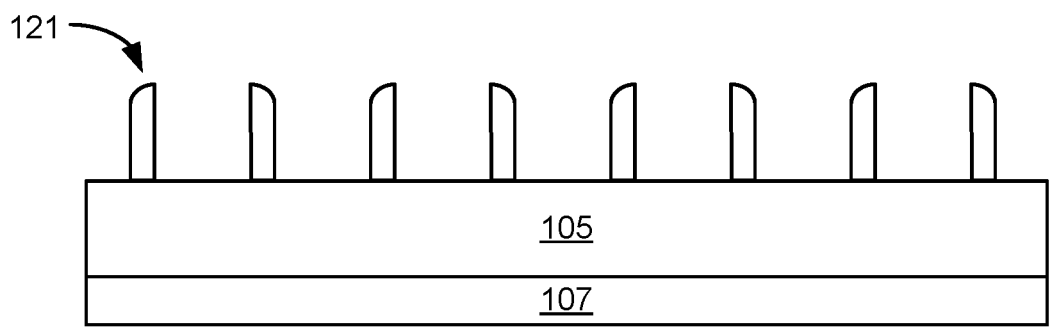

In FIG. 1H, the second conformal film 120 is directionally etched to form second spacers 121 flanking the patterned second core 113. In FIG. 1I, the patterned second core 113 is selectively removed to leave free-standing second spacers 125. Here, the patterned second core 113 may be etched using the same or similar chemistry as etching the patterned first core 101 in FIG. 1D.

Figure 1J:
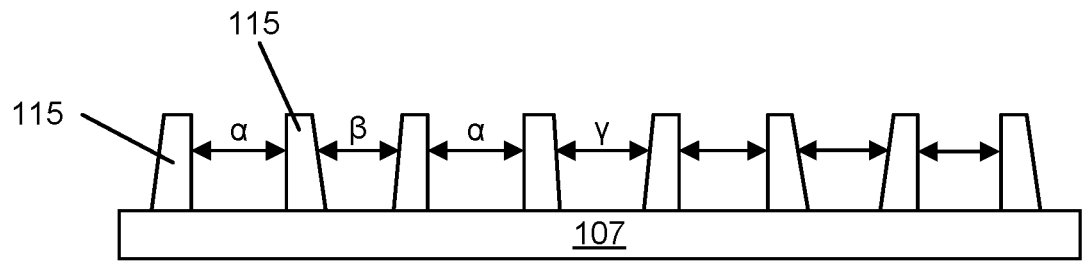

In FIG. 1J, when the pattern of the second spacers 125 is transferred to the target layer 105, the patterned target layer 115 includes varied critical dimensions α, β, and γ, which may all be different values. The asymmetry of the spacers 125 results in uneven etching to form the target layer thereby resulting in pitch walking. Etching of the target layer 105 using the asymmetrical spacers 125 results in ion angular distribution of the etching species that causes angled etching of the target layer. The process results in pitch walking in part because the dry etch conditions during removal of the patterned core material results in a shadowing effect.

Current patterning schemes and techniques are insufficient to form spacers that can be used to etch target layers without pitch walking. Provided herein are methods and apparatuses for forming symmetrical spacers using atomic layer deposition gapfill techniques. Symmetrical spacers provide an improved top profile such that use of the spacer as a mask to etch a target layer does not result in and/or reduces pitch walking. Symmetrical spacers include sharp corners that meet at a point that is about 90°±5°. Disclosed embodiments form spacers having sidewalls perpendicular to or substantially perpendicular to the top surface of the spacer. Substantially perpendicular is defined herein as having an angle of 90°±5°. Methods involve filling or partially filling features over a patterned substrate using ALD to form an overburden on the substrate, and planarizing the substrate and removing the gapfill material and core material to form symmetrical spacers. Symmetrical is defined herein as having substantially the same shape on either side of the spacer after core material is removed to leave free-standing spacers. For example, symmetrical spacers may have a planar top profile with the vertical surfaces of the spacers oriented at or about 90° from the top horizontal surface of the spacer.

Figure 2:
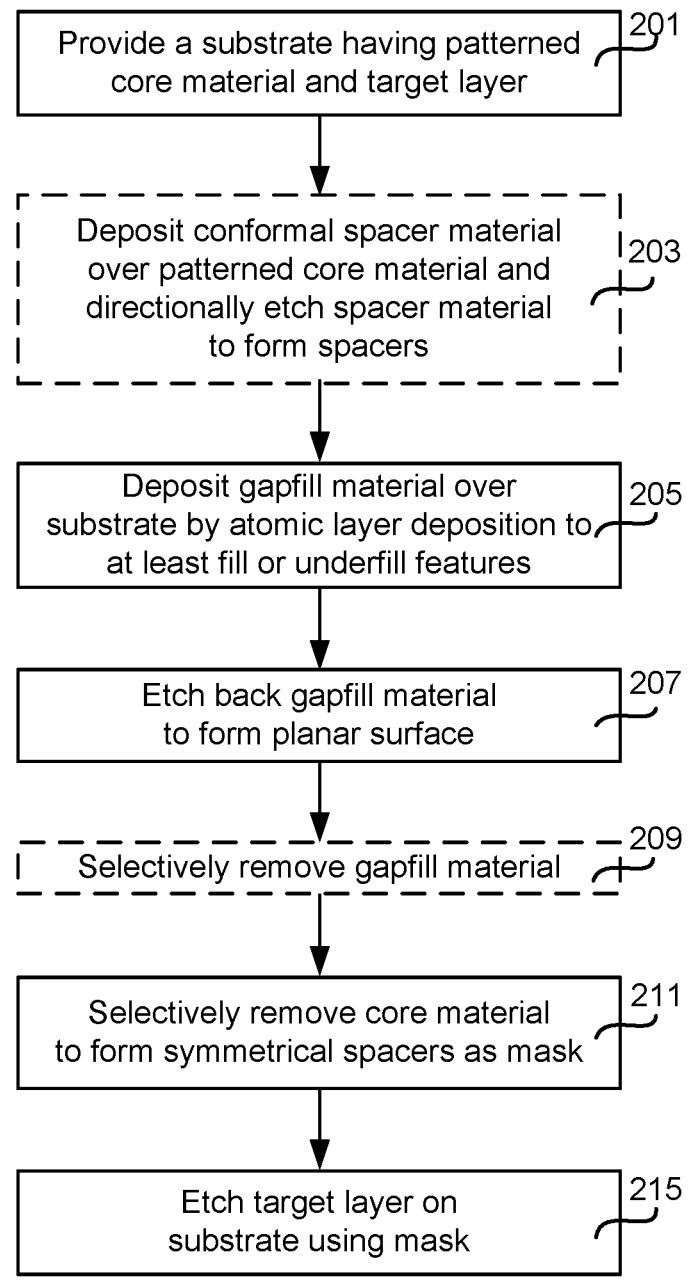
FIG. 2 is a process flow diagram depicting operations for a method performed in accordance with certain disclosed embodiments.

FIG. 2 is a process flow diagram depicting operations of a method performed in accordance with certain disclosed embodiments. One or more of the operations of FIG. 2 may be performed in various embodiments. In some embodiments, only one of the operations described in FIG. 2 is performed. For example, in some embodiments, a substrate is provided including symmetrical spacers formed as a mask and only operation 215 is performed to etch a target layer using the mask. In another example, a substrate is provided and only operation 211 is used to remove core material and form symmetrical spacers as a mask. It will be understood that these and other embodiments may be performed using any one or more of the operations described with respect to FIG. 2.

In operation 201, a substrate having a patterned core material and target layer is provided. The patterned core material may be a photoresist or may be made of amorphous carbon material or amorphous silicon material. In some embodiments, the core material may be transparent. The core material is deposited by a deposition technique, such as plasma enhanced chemical vapor deposition (PECVD), and the deposition technique may involve generating a plasma in a deposition chamber housing the substrate from deposition gases including a hydrocarbon precursor. The hydrocarbon precursor may be defined by the formula $C_aH_b$, where a is an integer between 2 and 10, and b is an integer between 2 and 24. Examples include methane ($CH_4$), acetylene ($C_2H_2$), ethylene ($C_2H_4$), propylene ($C_3H_6$), butane ($C_4H_{10}$), cyclohexane ($C_6H_{12}$), benzene ($C_6H_6$), and toluene ($C_7H_8$). A dual radio frequency (RF) plasma source including a high frequency (HF) power and a low frequency (LF) power may be used. The core material is deposited over a target layer prior to being patterned. The target layer may be the layer ultimately to be patterned. The target layer may be a semiconductor, dielectric, or other layer and may be made of silicon (Si), silicon oxide ($SiO_2$), silicon nitride (SiN), or titanium nitride (TiN), for example. The target layer may be deposited by atomic layer deposition (ALD), plasma-enhanced ALD (PEALD), chemical vapor deposition (CVD), or another suitable deposition technique.

Figure 3A:
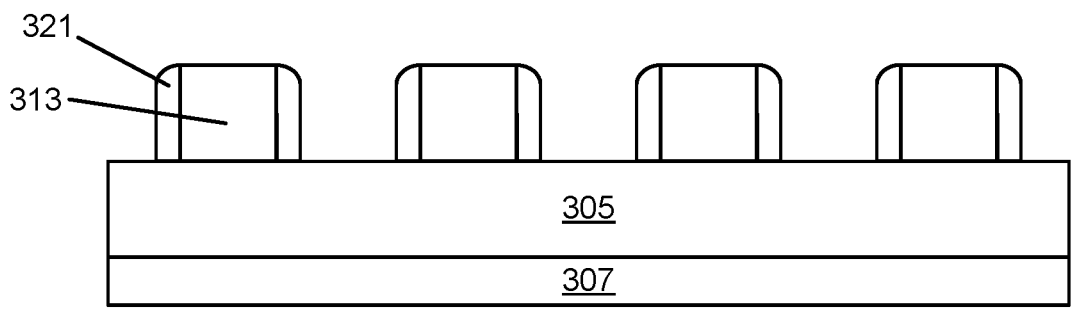
FIGS. 3A-3G are schematic illustrations of substrates in an example of a patterning scheme performed in accordance with certain disclosed embodiments.

In operation 203, a conformal film including spacer material is deposited over the patterned core material and the conformal film is directionally etched to form vertical spacers on the sidewalls of the patterned core material. FIG. 3A provides a schematic illustration of an example substrate including underlayer 307, target layer 305, patterned core material 313, and spacers 321. This is an example of the pattern on a substrate after performing operation 203 of FIG. 2. Note that operation 203 may be optional in some embodiments such as described below with respect to FIGS. 3J-3O.

Returning to FIG. 2, in operation 205, a gapfill material is deposited over the substrate by ALD. The gapfill material may be a silicon-containing material or, in some embodiments, a titanium-containing material. Examples include silicon oxide, silicon nitride, silicon carbide, and titanium oxide. The gapfill material may be deposited at any suitable temperature, such as between about 50° C. and about 400° C., or less than about 100° C., such as about 50° C. Gapfill material may be deposited using any suitable precursor, such as bisdiethylaminosilane, bistertbutylaminosilane, and diisopropylaminosilane. Further precursors are described below.

The gapfill material is deposited conformally using ALD. ALD is a technique that deposits thin layers of material using sequential self-limiting reactions. ALD processes use surface-mediated deposition reactions to deposit films on a layer-by-layer basis in cycles. As an example, an ALD cycle may include the following operations: (i) delivery/adsorption of a precursor, (ii) purging of the precursor from the chamber, (iii) delivery of a second reactant and optionally ignite plasma, and (iv) purging of byproducts from the chamber. The reaction between the second reactant and the adsorbed precursor to form a film on the surface of a substrate affects the film composition and properties, such as nonuniformity, stress, wet etch rate, dry etch rate, electrical properties (e.g., breakdown voltage and leakage current), etc.

In one example of an ALD process, a substrate surface that includes a population of surface active sites is exposed to a gas phase distribution of a first precursor, such as a silicon-containing precursor, in a dose provided to a chamber housing the substrate. Molecules of this first precursor are adsorbed onto the substrate surface, including chemisorbed species and/or physisorbed molecules of the first precursor. It should be understood that when a compound is adsorbed onto the substrate surface as described herein, the adsorbed layer may include the compound as well as derivatives of the compound. For example, an adsorbed layer of a silicon-containing precursor may include the silicon-containing precursor as well as derivatives of the silicon-containing precursor. After a first precursor dose, the chamber is then evacuated to remove most or all of first precursor remaining in gas phase so that mostly or only the adsorbed species remain. In some implementations, the chamber may not be fully evacuated. For example, the reactor may be evacuated such that the partial pressure of the first precursor in gas phase is sufficiently low to mitigate a reaction. A second reactant, such as an oxygen-containing gas, is introduced to the chamber so that some of these molecules react with the first precursor adsorbed on the surface. In some processes, the second reactant reacts immediately with the adsorbed first precursor. In other embodiments, the second reactant reacts only after a source of activation such as plasma is applied temporally. The chamber may then be evacuated again to remove unbound second reactant molecules. As described above, in some embodiments the chamber may not be completely evacuated. Additional ALD cycles may be used to build film thickness.

In some implementations, the ALD methods include plasma activation. As described herein, the ALD methods and apparatuses described herein may be conformal film deposition (CFD) methods, and apparatuses, which are described generally in U.S. patent application Ser. No. 13/084,399 (now U.S. Pat. No. 8,728,956), filed Apr. 11, 2011, and titled "PLASMA ACTIVATED CONFORMAL FILM DEPOSITION," and in U.S. patent application Ser. No. 13/084,305, filed Apr. 11, 2011, and titled "SILICON NITRIDE FILMS AND METHODS," which are herein incorporated by reference in their entireties.

For deposition of a silicon oxide gapfill material, the substrate may be exposed to cycles as follows. A silicon-containing precursor is introduced to adsorb the silicon-containing precursor onto the substrate surface. Silicon-containing precursors suitable for use in accordance with disclosed embodiments include polysilanes ($H_3Si$—$(SiH_2)_n$—$SiH_3$), where $n \geq 0$. Examples of silanes are silane ($SiH_4$), disilane ($Si_2H_6$), and organosilanes such as methylsilane, ethylsilane, isopropylsilane, t-butylsilane, dimethylsilane, diethylsilane, di-t-butylsilane, allylsilane, sec-butylsilane, thexylsilane, isoamylsilane, t-butyldisilane, di-t-butyldisilane, and the like.

A halosilane includes at least one halogen group and may or may not include hydrogens and/or carbon groups. Examples of halosilanes are iodosilanes, bromosilanes, chlorosilanes, and fluorosilanes. Although halosilanes, particularly fluorosilanes, may form reactive halide species that can etch silicon materials when a plasma is struck, a halosilane may not be introduced to the chamber when a plasma is struck in some embodiments, so formation of a reactive halide species from a halosilane may be mitigated. Specific chlorosilanes are tetrachlorosilane, trichlorosilane, dichlorosilane, monochlorosilane, chloroallylsilane, chloromethylsilane, dichloromethylsilane, chlorodimethylsilane, chloroethylsilane, t-butylchlorosilane, di-t-butylchlorosilane, chloroisopropylsilane, chloro-sec-butylsilane, t-butyldimethylchlorosilane, thexyldimethylchlorosilane, and the like.

An aminosilane includes at least one nitrogen atom bonded to a silicon atom, but may also contain hydrogens, oxygens, halogens, and carbons. Examples of aminosilanes are mono-, di-, tri- and tetra-aminosilane ($H_3Si(NH_2)$, $H_2Si(NH_2)_2$, $HSi(NH_2)_3$ and $Si(NH_2)_4$, respectively), as well as substituted mono-, di-, tri- and tetra-aminosilanes, for example, t-butylaminosilane, methylaminosilane, tert-butylsilanamine, bis(tert-butylamino) silane ($SiH_2(NHC(CH_3)_3)_2$ (BTBAS), tert-butyl silylcarbamate, $SiH(CH_3)$—$(N(CH_3)_2)_2$, $SiHCl$—$(N(CH_3)_2)_2$, $(Si(CH_3)_2NH)_3$ and the like. A further example of an aminosilane is trisilylamine ($N(SiH_3)$).

The chamber housing the substrate being processed may be purged to remove precursors that are not adsorbed onto the substrate surface. Purging the chamber may involve flowing a purge gas or a sweep gas, which may be a carrier gas used in other operations or may be a different gas. Example purge gases include argon, nitrogen, hydrogen, and helium. In various embodiments, the purge gas is an inert gas. Example inert gases include argon, nitrogen, and helium. In some embodiments, purging may involve evacuating the chamber. In some embodiments, purging may include one or more evacuation subphases for evacuating the process chamber. Alternatively, it will be appreciated that purging may be omitted in some embodiments.

The substrate including the adsorbed layer of silicon-containing precursor is exposed to an oxidant and a plasma is ignited under conditions to convert the adsorbed precursors to silicon oxide using the oxidizing plasma. Example oxidants include oxygen gas, water, carbon dioxide, nitrous oxide, and combinations thereof. In various embodiments, the substrate is exposed to an oxidant and an inert gas simultaneously while the plasma is ignited. For example, in one embodiment, a mixture of oxygen and argon is introduced to the substrate while the plasma is ignited. The chamber may then be purged again to remove unreacted oxidant and/or byproducts from the reaction for forming silicon oxide. These dose, purge, conversion, purge operations may be repeated in multiple cycles to deposit gapfill material layer by layer conformally over the substrate.

Figure 3B:
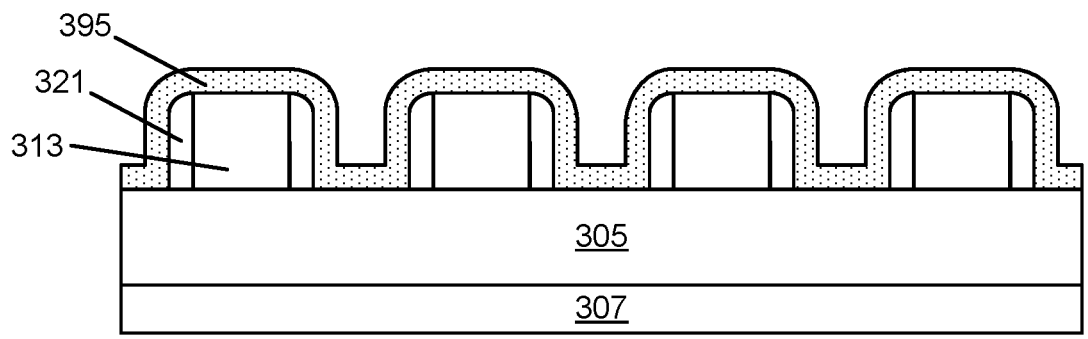
Figure 3C:
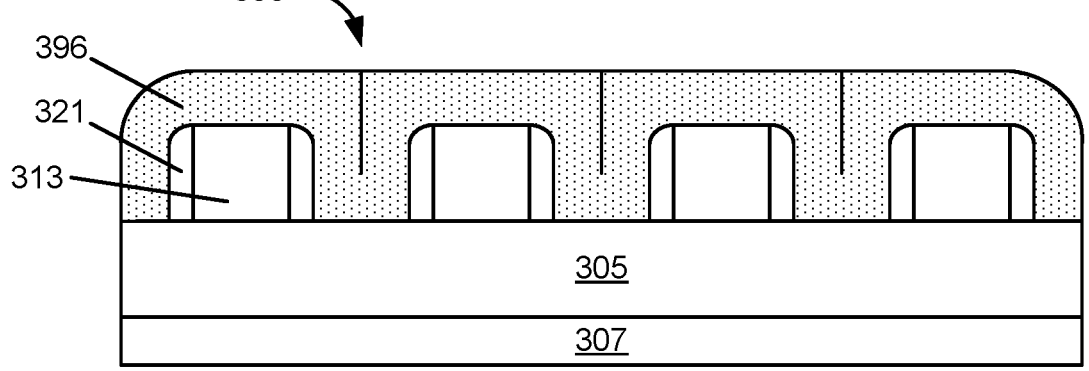
Figure 3D:
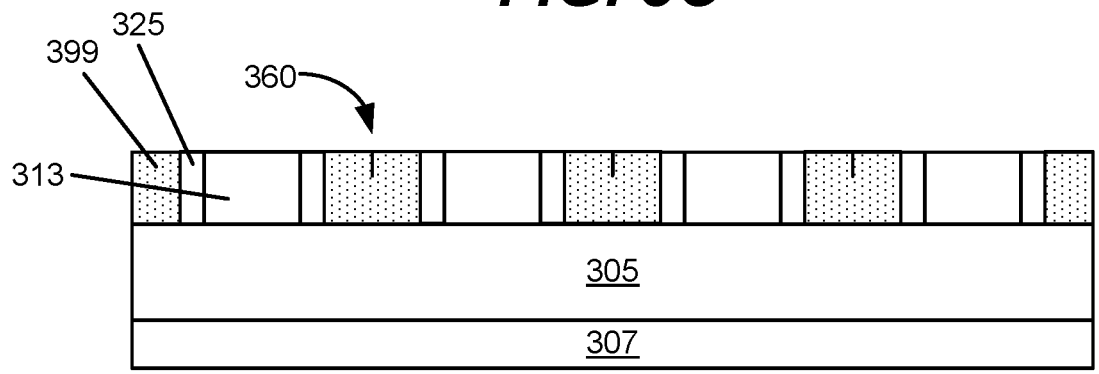
Figure 3E:
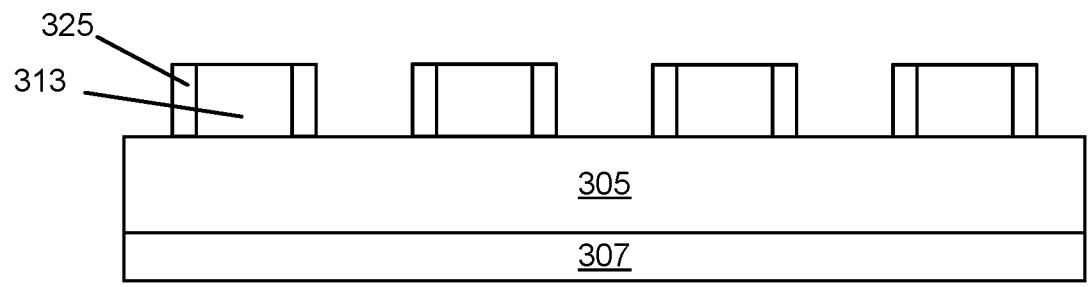
Figure 3F:
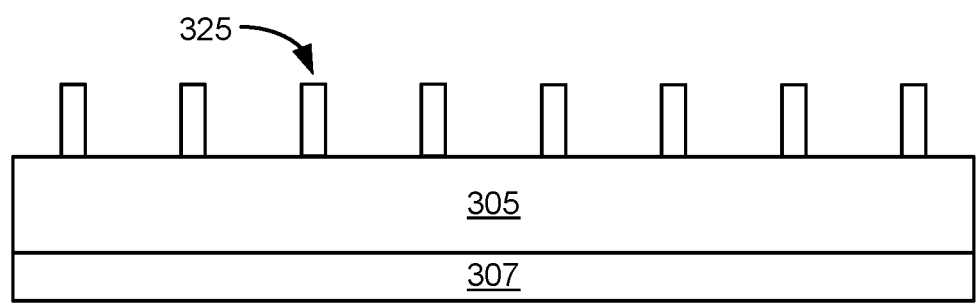
Figure 3G:
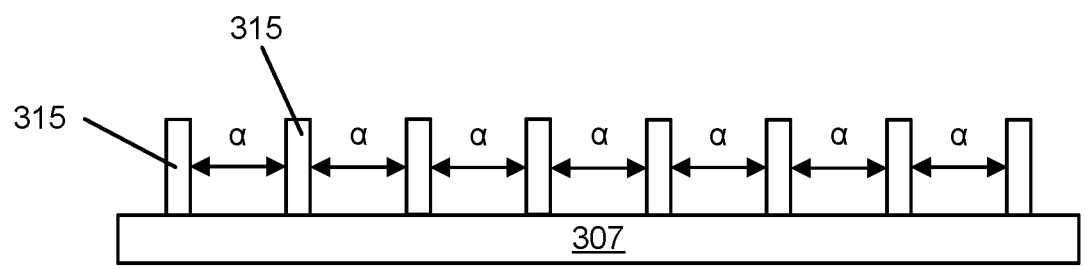

FIG. 3B shows an example schematic illustration of gapfill material 395 being deposited conformally over the substrate. As more cycles are performed, the features between the spacers 321 are filled and a seam 360 may form where the deposited material on sidewalls meet such as shown in FIG. 3C. FIG. 3C includes the gapfill material 396 deposited to include an overburden over the top surface of the patterned core material 313. Note that in some embodiments, depositing gapfill material in operation 205 of FIG. 2 may be performed for a number of cycles so as to underfill the feature or to deposit for a duration insufficient to completely fill the gaps. Underfilling is further described below with respect to FIGS. 3H and 3I. In some embodiments, the gapfill material deposited in operation 205 is used as the material to form the symmetrical spacers, as described below with respect to FIGS. 3J-3O for both complete fill and underfilling embodiments.

Returning to FIG. 2, in operation 207, the gapfill material is etched back to form a planar surface. Etch back or planarization may be performed using a wet etch process, dry etch process, or chemical mechanical planarization (CMP). In various embodiments, operation 207 further includes planarizing to form a planar surface across the gap fill material, spacer material, and patterned core. An example is provided in FIG. 3D, whereby the etched gapfill material 399, spacer material 325, and core material 313 have been planarized. Note there may be a small seam 360 left in the etched gapfill material 399.

Figure 3H:
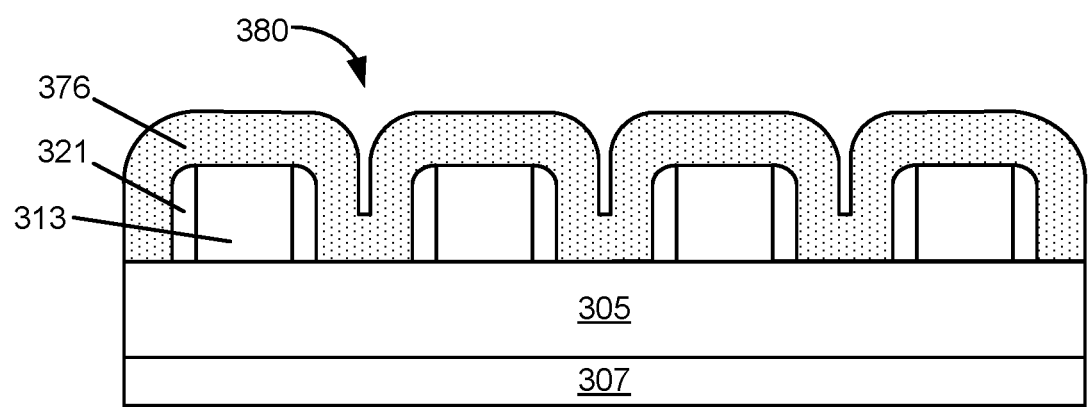
FIGS. 3H and 3I are schematic illustrations of substrates in an example scheme for underfilling features in accordance with certain disclosed embodiments.
Figure 3I:
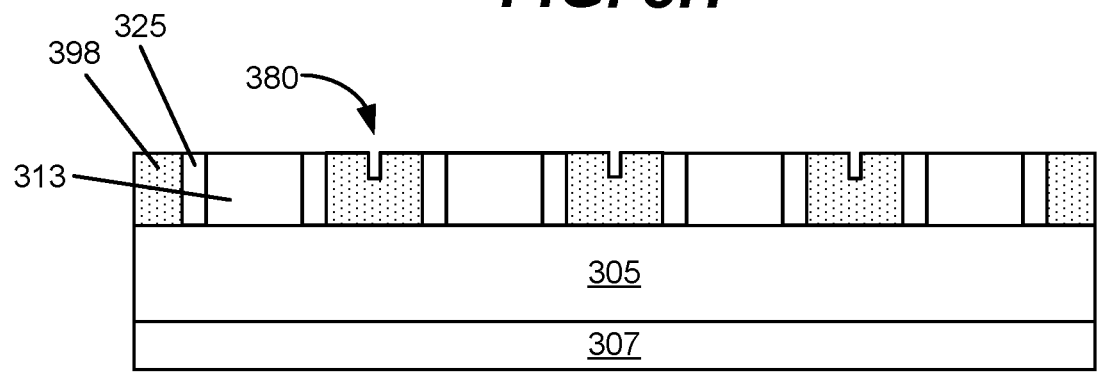

In an alternative embodiment, operation 205 of FIG. 2 is performed to deposit gapfill material such that features on the substrate are underfilled. For example, deposition cycles of ALD may be repeated for a number of cycles such that the distance in the space between the film deposited on the sidewalls is between about 5 nm and about 50 nm. An example is shown in FIG. 3H, which may follow FIG. 3B for underfilling embodiments. Gapfill material is deposited by ALD conformally over the substrate in FIG. 3B until the substrate is underfilled as shown in FIG. 3H, whereby a small gap 380 remains in the center of the features. The amount of gapfill material to be deposited depends on the amount deposited to at least provide sufficient thickness on the sidewalls. In some embodiments, the features have feature openings less than about x nm and the gapfill material is deposited for a duration sufficient to deposit the gapfill material to a thickness between about 0.4×x nm and about 0.5×x nm. In some embodiments, the features have feature openings less than about 5 nm and the gapfill material is deposited for a duration sufficient to deposit the gapfill material to a thickness between about 2 nm and about 2.5 nm. For example, gapfill material may be deposited to a thickness between about 20 nm and about 30 nm for features having a feature opening of about 50 nm. Instead of completely filling the feature to form a seam as shown in FIG. 3C, the substrate may be etched back in operation 207 to form etched gapfill material 398, which still has a small gap 380. However, because the gapfill material is a sacrificial layer used to form symmetrical spacers 325, the gapfill material in operation 205 may be underfilled instead of completely filled in some embodiments.

Returning to FIG. 2, in operation 209, the gapfill material is selectively removed to leave patterned core material and spacer material on the substrate. An example is provided in FIG. 3E. As shown, the gapfill material is removed to yield core material 313 and sidewall spacers 325 over target layer 305. Note that in embodiments whereby the gapfill material is used to form the symmetrical spacers, this operation is not performed.

Returning to FIG. 2, in operation 211, the core material is selectively etched to form symmetrical spacers as a mask. An example is provided in FIG. 3F. As shown, spacers 325 are symmetrical and not subject to leaning, as compared to spacers 121 shown in FIG. 1I.

Returning to FIG. 2, in operation 215, the target layer is etched using the symmetrical spacers as a mask. An example is provided in FIG. 3G, such that the etched target layer 315 have consistent critical dimensions $\alpha$, as compared to the varied critical dimensions that resulted in FIG. 1J.

Figure 3J:
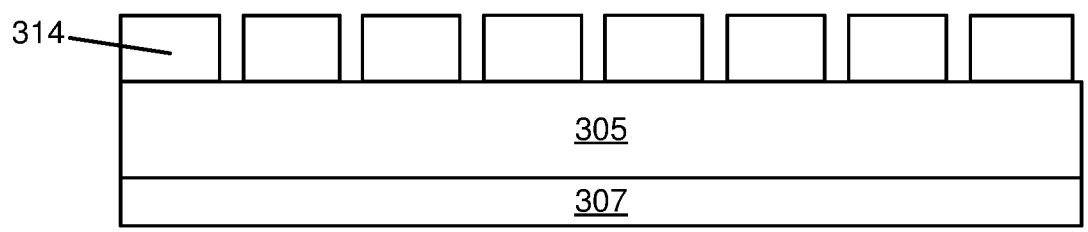
FIGS. 3J-3O are schematic illustrations of substrates in an example of a patterning scheme performed in accordance with certain disclosed embodiments.
Figure 3K:
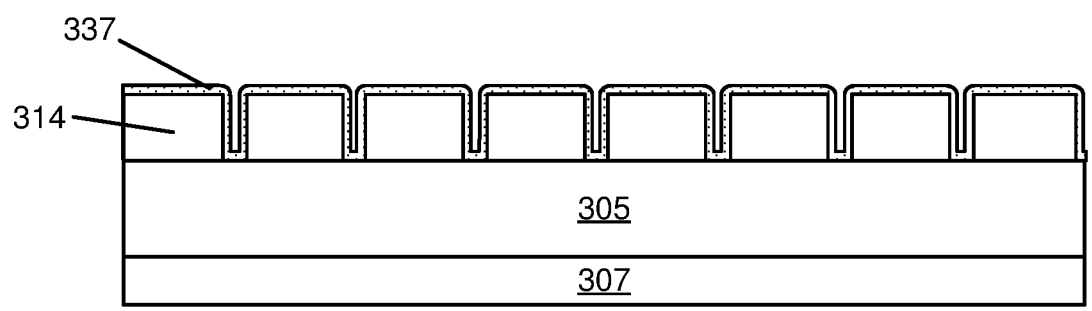
Figure 3L:
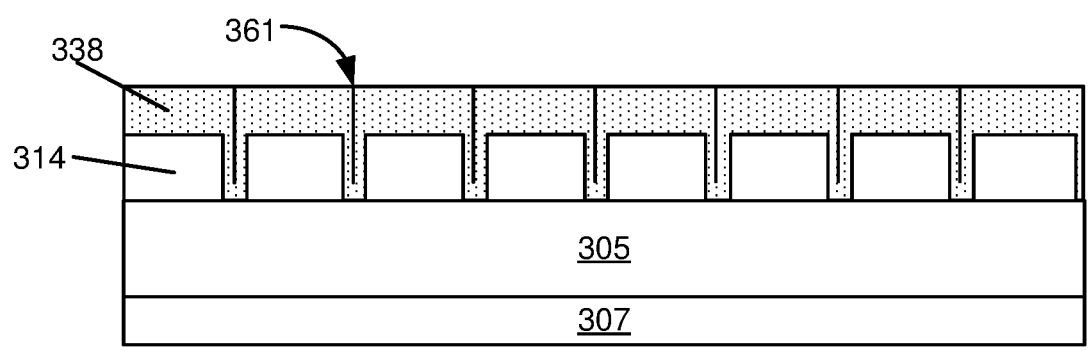
Figure 3M:
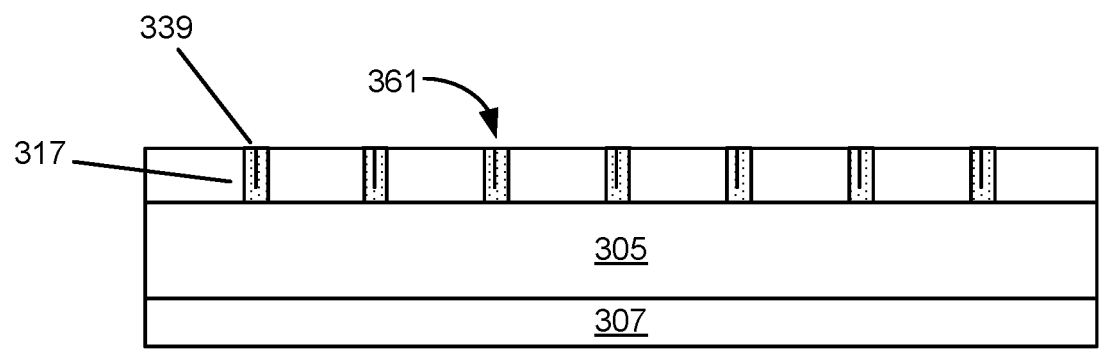
Figure 3N:
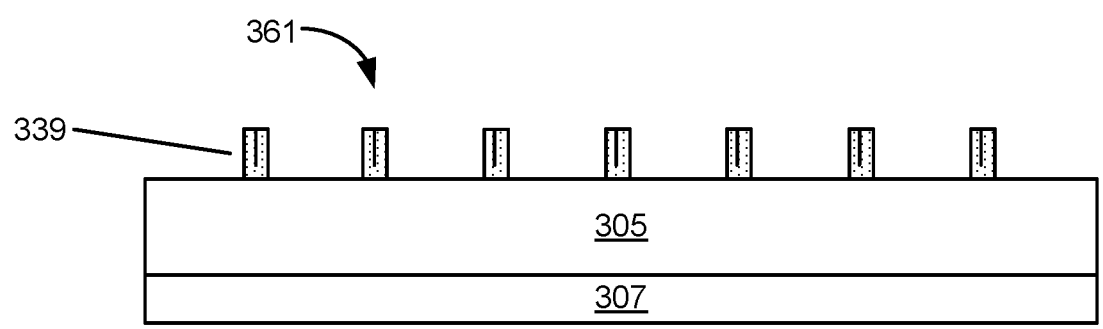
Figure 3O:
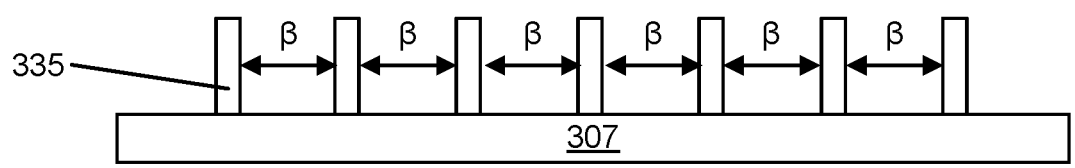
Figure 3P:
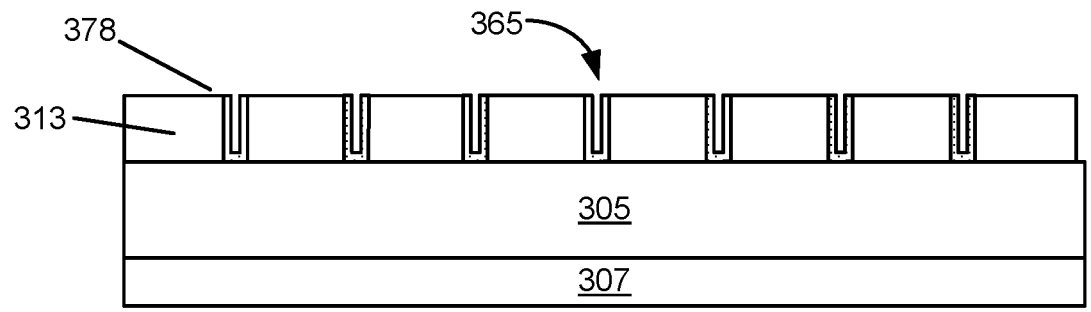
FIGS. 3P-3R are schematic illustrations of substrates in an example scheme for underfilling features in accordance with certain disclosed embodiments.
Figure 3Q:
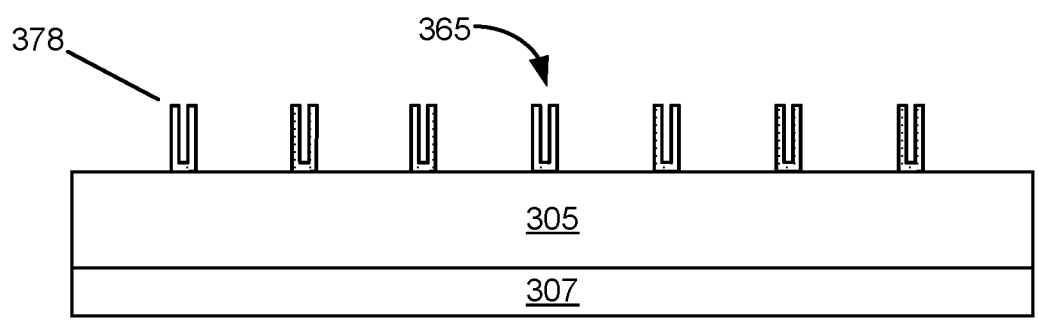
Figure 3R:
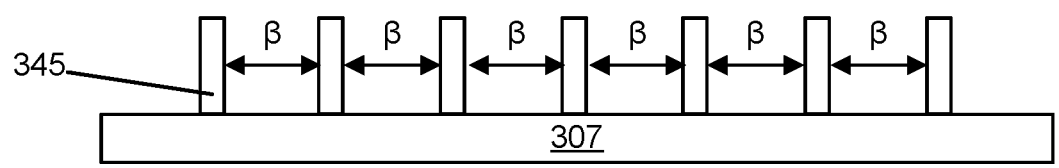

FIGS. 3J-3R provide alternative embodiments for performing certain disclosed embodiments. For example, FIGS. 3J-3O involve forming free-standing symmetrical spacers using gapfill material by depositing gapfill material directly over the substrate such that operation 203 of FIG. 2 is not performed. FIGS. 3P-3R present an example of another embodiment involving underfilling whereby operation 203 of FIG. 2 is not performed and the underfilled gapfill material is used as spacers to pattern the target layer. These embodiments are described in further detail below.

In FIG. 3J, a substrate is provided including an underlayer 307, a target layer 305, and a patterned core 314. In FIG. 3K, a gapfill material 337 is deposited conformally over the substrate using atomic layer deposition. Example gapfill material that may be used and deposition techniques that may be used are described above with respect to operation 205 of FIG. 2. In FIG. 3L, the gapfill material 338 has been deposited until the features or gaps between the patterned core 314 are completely filled, thereby causing the formation of a seam 361 where the deposited material on the sidewalls meet. Note that in some embodiments, underfilling may be performed so as to leave a small gap in the middle of the feature, as described below with respect to FIGS. 3P-3R.

In FIG. 3M, the substrate is planarized to yield a planar surface including the now planarized core 317 and planarized gapfill material 339. Note the seam 361 may still be present in the gapfill material 339. Planarization may be performed in accordance with operation 207 as described above with respect to FIG. 2. In FIG. 3N, the planarized core material 317 is selectively etched to leave free-standing symmetrical spacers 339, each of which may still include the seam 361. The core material may be removed as described above with respect to operation 211 of FIG. 2. In FIG. 3O, the symmetrical spacers are used as a mask to etch the target layer 305 and the mask is then removed to yield a patterned target layer 335. Note that the ion angular distribution of the etching species used to etch the target material can effectively etch the target layer to yield a pattern having consistent critical dimensions $\beta$.

FIGS. 3P-3R provide an alternative embodiment for underfilling features while using gapfill material as a symmetrical spacer mask. For example, the substrate in FIG. 3K may be subject to multiple cycles of atomic layer deposition to partially fill the features, thereby leaving a gap 365 in the features. The substrate may be planarized per operation 207 of FIG. 2 to yield the substrate shown in FIG. 3P having a planarized surface whereby the field regions of the gapfill material 378 are flush with the field regions of the core material 313. In FIG. 3Q, the core material is selectively removed per operation 211 of FIG. 2 to yield free-standing symmetrical spacers 378, each of which may still include the gap 365 from underfilling the features. The spacers 378 may be used to pattern the target layer 305 and the ion angular distribution of the etching species used to etch the target layer 305 does not result in angular etching because the spacers 378 are symmetrical, thereby forming a patterned target layer 345 having with consistent critical dimensions β.

Certain disclosed embodiments are suitable for applications where gapfill material is deposited into existing features having a critical dimension between about 2 nm and about 200 nm. Disclosed embodiments are suitable for applications at a node less than 20 nm. Disclosed embodiments are also suitable for forming patterned substrates where gapfill material is deposited into existing features having aspect ratios greater than about 20:1.

Apparatus

Figure 4:
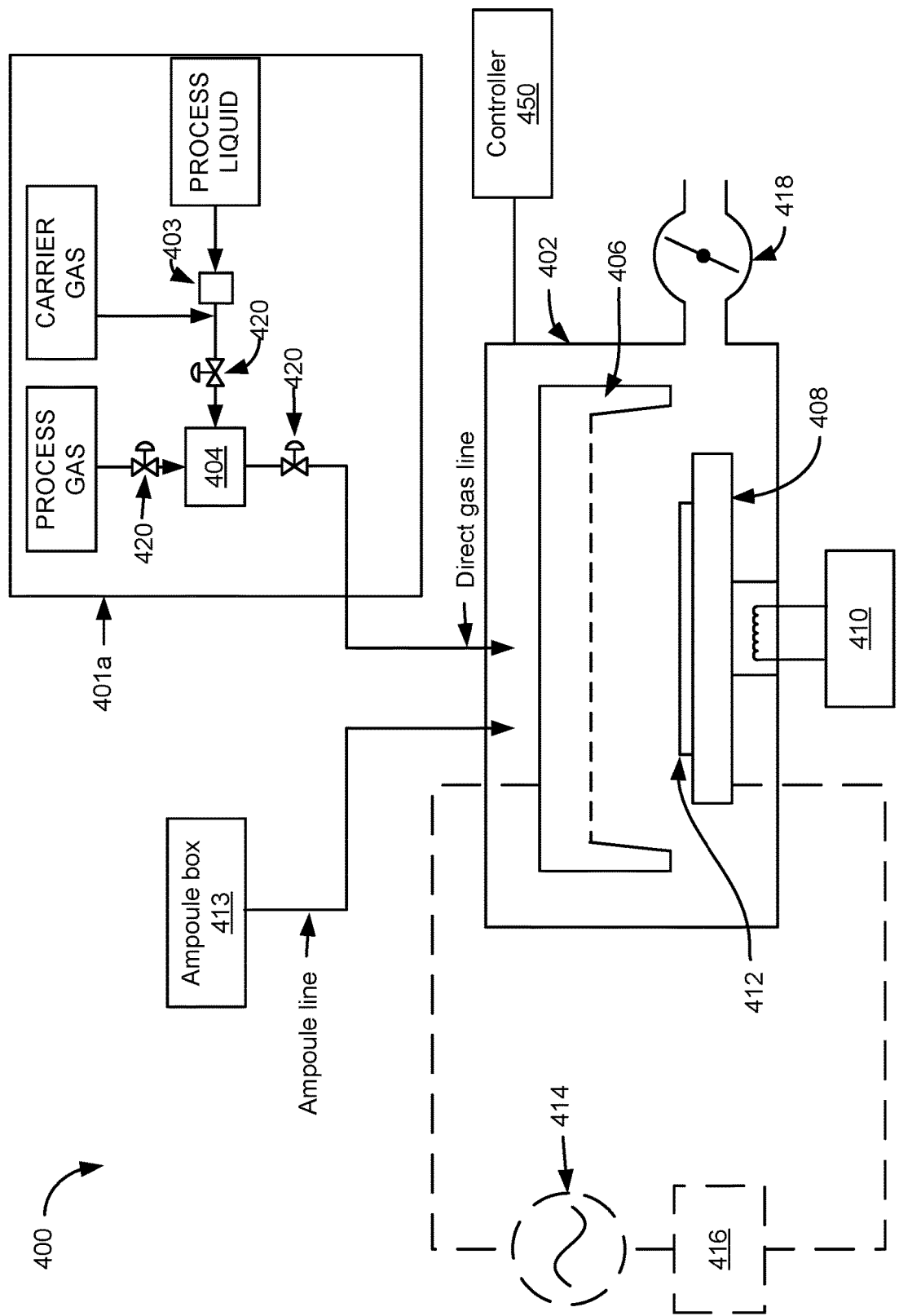
FIGS. 4 and 6 are schematic diagrams of example process chambers for performing certain disclosed embodiments.
Figure 5:
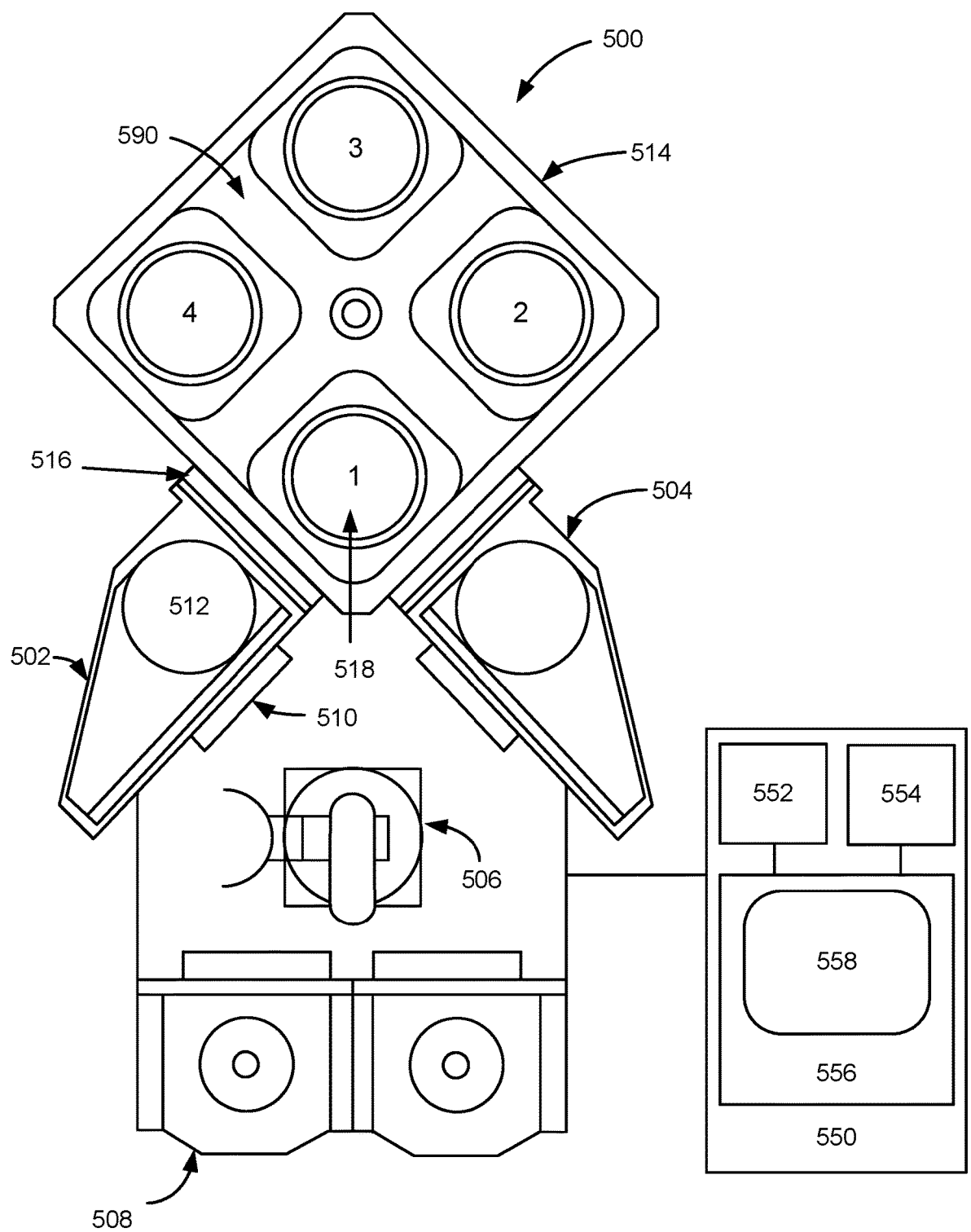
FIGS. 5 and 7 are schematic diagram of example process tools for performing certain disclosed embodiments.

FIG. 4 depicts a schematic illustration of an embodiment of an atomic layer deposition (ALD) process station 400 having a process chamber 402. Process chamber 402 may be used for maintaining a low-pressure environment. A plurality of ALD process stations may be included in a common low pressure process tool environment. For example, FIG. 5 depicts an embodiment of a multi-station processing tool 500. In some embodiments, one or more hardware parameters of ALD process station 400, including those discussed in detail below, may be adjusted programmatically by one or more computer controllers 450.

ALD process station 400 fluidly communicates with reactant delivery system 401a for delivering process gases to a distribution showerhead 406. Reactant delivery system 401a includes a mixing vessel 404 for blending and/or conditioning process gases, such as a silicon-containing gas, or oxygen-containing gas, for delivery to showerhead 406. One or more mixing vessel inlet valves 420 may control introduction of process gases to mixing vessel 404.

As an example, the embodiment of FIG. 4 includes a vaporization point 403 for vaporizing liquid reactant to be supplied to the mixing vessel 404. In some embodiments, vaporization point 403 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve purging and/or evacuating the delivery piping to remove residual reactant. However, purging the delivery piping may increase process station cycle time, degrading process station throughput. Thus, in some embodiments, delivery piping downstream of vaporization point 403 may be heat traced. In some examples, mixing vessel 404 may also be heat traced. In one non-limiting example, piping downstream of vaporization point 403 has an increasing temperature profile extending from approximately 100° C. to approximately 150° C. at mixing vessel 404.

In some embodiments, a liquid precursor or liquid reactant may be vaporized at a liquid injector (not shown). For example, a liquid injector may inject pulses of a liquid reactant into a carrier gas stream upstream of the mixing vessel 404. In one embodiment, a liquid injector may vaporize the reactant by flashing the liquid from a higher pressure to a lower pressure. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 403. In one scenario, a liquid injector may be mounted directly to mixing vessel 404. In another scenario, a liquid injector may be mounted directly to showerhead 406.

In some embodiments, a liquid flow controller (LFC) upstream of vaporization point 403 may be provided for controlling a mass flow of liquid for vaporization and delivery to process chamber 402. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, this may be performed by disabling a sense tube of the LFC and the PID controller.

Showerhead 406 distributes process gases toward substrate 412. In the embodiment shown in FIG. 4, the substrate 412 is located beneath showerhead 406 and is shown resting on a pedestal 408. Showerhead 406 may have any suitable shape, and may have any suitable number and arrangement of ports for distributing process gases to substrate 412.

In some embodiments, pedestal 408 may be raised or lowered to expose substrate 412 to a volume between the substrate 412 and the showerhead 406. In some embodiments, pedestal 408 may be temperature controlled via heater 410. Pedestal 408 may be set to any suitable temperature, such as between about 25° C. and about 650° C. during operations for performing various disclosed embodiments. It will be appreciated that, in some embodiments, pedestal height may be adjusted programmatically by a suitable computer controller 450.

In another scenario, adjusting a height of pedestal 408 may allow a plasma density to be varied during plasma activation cycles performed in certain disclosed embodiments. At the conclusion of a process phase, pedestal 408 may be lowered during another substrate transfer phase to allow removal of substrate 412 from pedestal 408.

In some embodiments, a position of showerhead 406 may be adjusted relative to pedestal 408 to vary a volume between the substrate 412 and the showerhead 406. Further, it will be appreciated that a vertical position of pedestal 408 and/or showerhead 406 may be varied by any suitable mechanism within the scope of the present disclosure. In some embodiments, pedestal 408 may include a rotational axis for rotating an orientation of substrate 412. It will be appreciated that, in some embodiments, one or more of these example adjustments may be performed programmatically by one or more suitable computer controllers 450. The computer controller 450 may include any of the features described below with respect to controller 550 of FIG. 5.

In some embodiments where plasma may be used as discussed above, showerhead 406 and pedestal 408 electrically communicate with a radio frequency (RF) power supply 414 and matching network 416 for powering a plasma. In some embodiments, the plasma energy may be controlled by controlling one or more of a process station pressure, a gas concentration, an RF source power, an RF source frequency, and a plasma power pulse timing. For example, RF power supply 414 and matching network 416 may be operated at any suitable power to form a plasma having a desired composition of radical species. Likewise, RF power supply 414 may provide RF power of any suitable frequency. In some embodiments, RF power supply 414 may be configured to control high- and low-frequency RF power sources independently of one another. Example low-frequency RF frequencies may include, but are not limited to, frequencies between 0 kHz and 500 kHz. Example high-frequency RF frequencies may include, but are not limited to, frequencies between 1.8 MHz and 2.45 GHz, or greater than about 13.56 MHz, or greater than 27 MHz, or greater than 40 MHz, or greater than 60 MHz. It will be appreciated that any suitable parameters may be modulated discretely or continuously to provide plasma energy for the surface reactions.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, instructions for a controller 450 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a first recipe phase may include instructions for setting a flow rate of an inert and/or a reactant gas (e.g., the first precursor such as a silicon-containing precursor), instructions for setting a flow rate of a carrier gas (such as argon), and time delay instructions for the first recipe phase. A second, subsequent recipe phase may include instructions for modulating or stopping a flow rate of an inert and/or a reactant gas, and instructions for modulating a flow rate of a carrier or purge gas and time delay instructions for the second recipe phase. A third recipe phase may include instructions for modulating a flow rate of a second reactant gas such as oxygen, instructions for modulating the flow rate of a carrier or purge gas, instructions for igniting a plasma having high plasma energy, and time delay instructions for the third recipe phase. A fourth, subsequent recipe phase may include instructions for modulating or stopping a flow rate of an inert and/or a reactant gas, and instructions for modulating a flow rate of a carrier or purge gas and time delay instructions for the fourth recipe phase. Such recipes may be used to deposit gapfill material over a patterned substrate to subsequently form symmetrical spacers. Some recipes may be used to underfill a patterned substrate with gapfill material. It will be appreciated that these recipe phases may be further subdivided and/or iterated in any suitable way within the scope of the present disclosure.

Further, in some embodiments, pressure control for process station 400 may be provided by butterfly valve 418. As shown in the embodiment of FIG. 4, butterfly valve 418 throttles a vacuum provided by a downstream vacuum pump (not shown). However, in some embodiments, pressure control of process station 400 may also be adjusted by varying a flow rate of one or more gases introduced to the process station 400.

As described above, one or more process stations may be included in a multi-station processing tool. FIG. 5 shows a schematic view of an embodiment of a multi-station processing tool 500 with an inbound load lock 502 and an outbound load lock 504, either or both of which may include a remote plasma source (not shown). A robot 506, at atmospheric pressure, is configured to move wafers from a cassette loaded through a pod 508 into inbound load lock 502 via an atmospheric port 510. A wafer (not shown) is placed by the robot 506 on a pedestal 512 in the inbound load lock 502, the atmospheric port 510 is closed, and the inbound load lock 502 is pumped down. Where the inbound load lock 502 includes a remote plasma source, the wafer may be exposed to a remote plasma treatment in the inbound load lock 502 prior to being introduced into a processing chamber 514. Further, the wafer also may be heated in the inbound load lock 502 as well, for example, to remove moisture and adsorbed gases. Next, a chamber transport port 516 to processing chamber 514 is opened, and another robot (not shown) places the wafer into the reactor on a pedestal of a first station shown in the reactor for processing. While the embodiment depicted in FIG. 5 includes load locks, it will be appreciated that, in some embodiments, direct entry of a wafer into a process station may be provided.

The depicted processing chamber 514 includes four process stations, numbered from 1 to 4 in the embodiment shown in FIG. 5. Each station has a heated pedestal (shown at 518 for station 1), and gas line inlets. It will be appreciated that in some embodiments, each process station may have different or multiple purposes. For example, in some embodiments, a process station may be switchable between an ALD and plasma-enhanced ALD process mode. In some embodiments, exposure to a deposition precursor and exposure to a second reactant and plasma are performed in the same station. Additionally or alternatively, in some embodiments, processing chamber 514 may include one or more matched pairs of ALD and plasma-enhanced ALD process stations. While the depicted processing chamber 514 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 5 depicts an embodiment of a wafer handling system 590 for transferring wafers within processing chamber 514. In some embodiments, wafer handling system 590 may transfer wafers between various process stations and/or between a process station and a load lock. It will be appreciated that any suitable wafer handling system may be employed. Non-limiting examples include wafer carousels and wafer handling robots. FIG. 5 also depicts an embodiment of a system controller 550 employed to control process conditions and hardware states of process tool 500. System controller 550 may include one or more memory devices 556, one or more mass storage devices 554, and one or more processors 552. Processor 552 may include a CPU or computer, analog, and/or digital input/output connections, stepper motor controller boards, etc.

In some embodiments, system controller 550 controls all of the activities of process tool 500. System controller 550 executes system control software 558 stored in mass storage device 554, loaded into memory device 556, and executed on processor 552. Alternatively, the control logic may be hard coded in the controller 550. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 558 may include instructions for controlling the timing, mixture of gases, gas flow rates, chamber and/or station pressure, chamber and/or station temperature, wafer temperature, target power levels, RF power levels, substrate pedestal, chuck and/or susceptor position, and other parameters of a particular process performed by process tool 500. System control software 558 may be configured in any suitable way. For example, various process tool component subroutines or control objects may be written to control operation of the process tool components used to carry out various process tool processes. System control software 558 may be coded in any suitable computer readable programming language.

In some embodiments, system control software 558 may include input/output control (IOC) sequencing instructions for controlling the various parameters described above. Other computer software and/or programs stored on mass storage device 554 and/or memory device 556 associated with system controller 550 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 518 and to control the spacing between the substrate and other parts of process tool 500.

A process gas control program may include code for controlling gas composition (e.g., silicon-containing gases, oxygen-containing gases, and purge gases as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 550. The user interface may include a display screen, graphical software displays of the apparatus and/or process conditions, and user input devices such as pointing devices, keyboards, touch screens, microphones, etc.

In some embodiments, parameters adjusted by system controller 550 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 550 from various process tool sensors. The signals for controlling the process may be output on the analog and digital output connections of process tool 500. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 550 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller 550 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller 550.

In some implementations, the system controller 550 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 550, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 550 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 550 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 550, in some implementations, may be a part of or coupled to a computer that is integrated with, coupled to the system, otherwise networked to the system, or a combination thereof. For example, the system controller 550 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 550 receives instructions in the form of data, which specify parameters for each of the processing steps to be performed during one or more operations. It should be understood that the parameters may be specific to the type of process to be performed and the type of tool that the system controller 550 is configured to interface with or control. Thus as described above, the system controller 550 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the system controller 550 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

An appropriate apparatus for performing the methods disclosed herein is further discussed and described in U.S. patent application Ser. No. 13/084,399 (now U.S. Pat. No. 8,728,956), filed Apr. 11, 2011, and titled "PLASMA ACTIVATED CONFORMAL FILM DEPOSITION"; and Ser. No. 13/084,305, filed Apr. 11, 2011, and titled "SILICON NITRIDE FILMS AND METHODS," each of which is incorporated herein in its entireties.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Etching operations described herein, such as for etching core material selective to the spacer material, may be performed in any suitable process chamber. In some embodiments, substrates may be etched in an inductively coupled plasma (ICP) reactor as described below with respect to FIG. 6.

Inductively coupled plasma (ICP) reactors which, in certain embodiments, may be suitable for etching operations are now described. Such ICP reactors have also described in U.S. Patent Application Publication No. 2014/0170853, filed Dec. 10, 2013, and titled "IMAGE REVERSAL WITH AHM GAP FILL FOR MULTIPLE PATTERNING," hereby incorporated by reference in its entirety and for all purposes. Although ICP reactors are described herein, in some embodiments, it should be understood that capacitively coupled plasma reactors may also be used.

Figure 6:
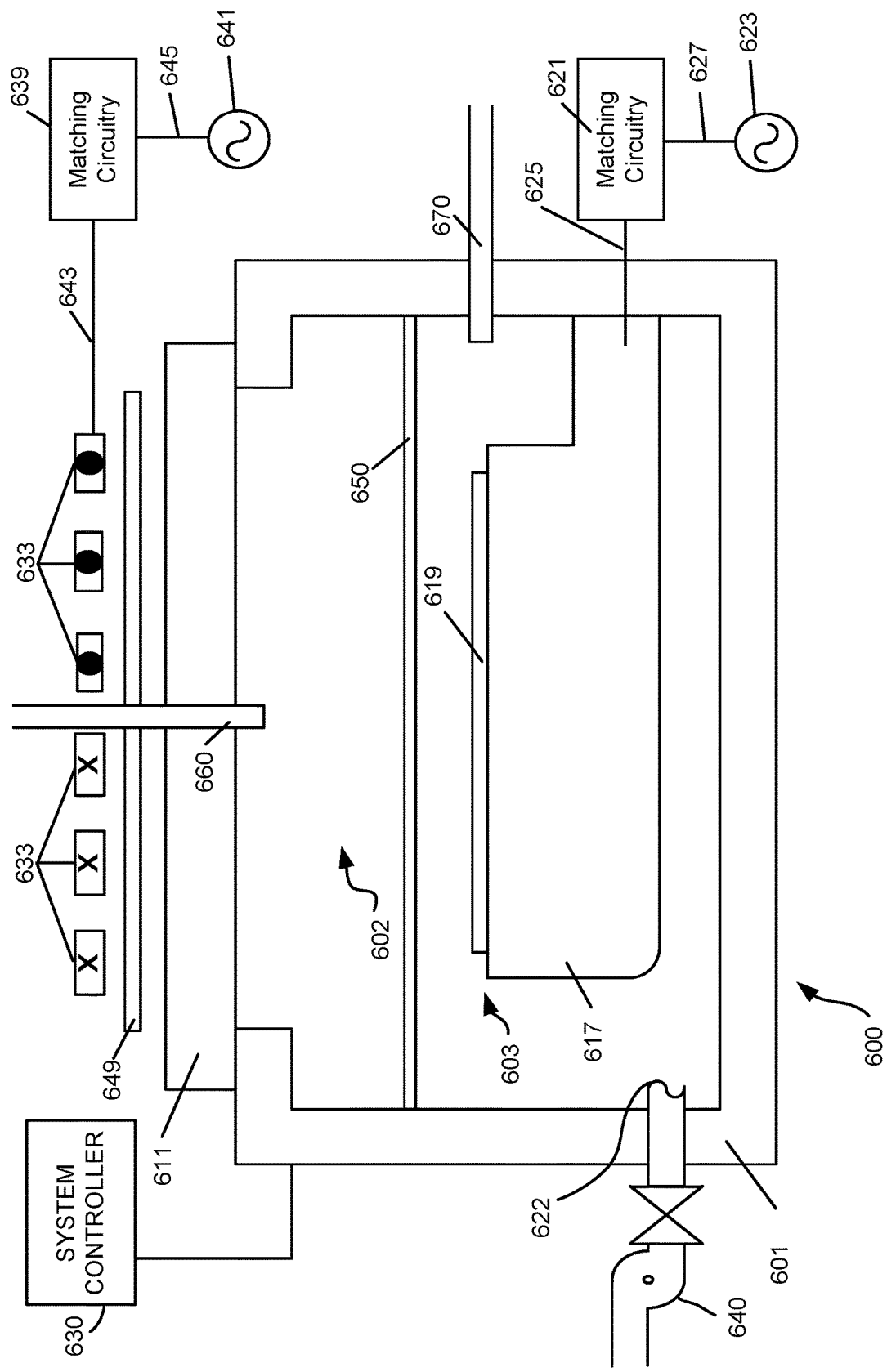

FIG. 6 schematically shows a cross-sectional view of an inductively coupled plasma integrated etching and deposition apparatus 600 appropriate for implementing certain embodiments herein, an example of which is a Kiyo™ reactor, produced by Lam Research Corp. of Fremont, Calif. The inductively coupled plasma apparatus 600 includes an overall process chamber structurally defined by chamber walls 601 and a window 611. The chamber walls 601 may be fabricated from stainless steel or aluminum. The window 611 may be fabricated from quartz or other dielectric material. An optional internal plasma grid 650 divides the overall processing chamber into an upper sub-chamber 602 and a lower sub-chamber 603. In most embodiments, plasma grid 650 may be removed, thereby utilizing a chamber space made of sub-chambers 602 and 603. A chuck 617 is positioned within the lower sub-chamber 603 near the bottom inner surface. The chuck 617 is configured to receive and hold a semiconductor wafer 619 upon which the etching and deposition processes are performed. The chuck 617 can be an electrostatic chuck for supporting the wafer 619 when present. In some embodiments, an edge ring (not shown) surrounds chuck 617, and has an upper surface that is approximately planar with a top surface of a wafer 619, when present over chuck 617. The chuck 617 also includes electrostatic electrodes for chucking and dechucking the wafer. A filter and DC clamp power supply (not shown) may be provided for this purpose. Other control systems for lifting the wafer 619 off the chuck 617 can also be provided. The chuck 617 can be electrically charged using an RF power supply 623. The RF power supply 623 is connected to matching circuitry 621 through a connection 627. The matching circuitry 621 is connected to the chuck 617 through a connection 625. In this manner, the RF power supply 623 is connected to the chuck 617.

Elements for plasma generation include a coil 633 is positioned above window 611. In some embodiments, a coil is not used in disclosed embodiments. The coil 633 is fabricated from an electrically conductive material and includes at least one complete turn. The example of a coil 633 shown in FIG. 6 includes three turns. The cross-sections of coil 633 are shown with symbols, and coils having an "X" extend rotationally into the page, while coils having a "●" extend rotationally out of the page. Elements for plasma generation also include an RF power supply 641 configured to supply RF power to the coil 633. In general, the RF power supply 641 is connected to matching circuitry 639 through a connection 645. The matching circuitry 639 is connected to the coil 633 through a connection 643. In this manner, the RF power supply 641 is connected to the coil 633. An optional Faraday shield 649 is positioned between the coil 633 and the window 611. The Faraday shield 649 is maintained in a spaced apart relationship relative to the coil 633. The Faraday shield 649 is disposed immediately above the window 611. The coil 633, the Faraday shield 649, and the window 611 are each configured to be substantially parallel to one another. The Faraday shield may prevent metal or other species from depositing on the dielectric window of the plasma chamber.

Process gases may be flowed into the processing chamber through one or more main gas flow inlets 660 positioned in the upper chamber and/or through one or more side gas flow inlets 670. Likewise, though not explicitly shown, similar gas flow inlets may be used to supply process gases to a capacitively coupled plasma processing chamber. A vacuum pump, e.g., a one or two stage mechanical dry pump and/or turbomolecular pump 640, may be used to draw process gases out of the process chamber 624 and to maintain a pressure within the process chamber 601. For example, the pump may be used to evacuate the chamber 601. A valve-controlled conduit may be used to fluidically connect the vacuum pump to the processing chamber so as to selectively control application of the vacuum environment provided by the vacuum pump. This may be done employing a closed-loop-controlled flow restriction device, such as a throttle valve (not shown) or a pendulum valve (not shown), during operational plasma processing. Likewise, a vacuum pump and valve controlled fluidic connection to the capacitively coupled plasma processing chamber may also be employed.

During operation of the apparatus, one or more process gases may be supplied through the gas flow inlets 660 and/or 670. In certain embodiments, process gas may be supplied only through the main gas flow inlet 660, or only through the side gas flow inlet 670. In some cases, the gas flow inlets shown in the figure may be replaced with more complex gas flow inlets, one or more showerheads, for example. The Faraday shield 649 and/or optional grid 650 may include internal channels and holes that allow delivery of process gases to the chamber. Either or both of Faraday shield 649 and optional grid 650 may serve as a showerhead for delivery of process gases. In some embodiments, a liquid vaporization and delivery system may be situated upstream of the chamber 601, such that once a liquid reactant is vaporized, the vaporized reactant is introduced into the chamber via a gas flow inlet 660 and/or 670.

Radio frequency power is supplied from the RF power supply 641 to the coil 633 to cause an RF current to flow through the coil 633. The RF current flowing through the coil 633 generates an electromagnetic field about the coil 633. The electromagnetic field generates an inductive current within the upper sub-chamber 602. The physical and chemical interactions of various generated ions and radicals with the wafer 619 selectively etch features of and deposit layers on the wafer.

If the plasma grid is used such that there is both an upper sub-chamber 602 and a lower sub-chamber 603, the inductive current acts on the gas present in the upper sub-chamber 602 to generate an electron-ion plasma in the upper sub-chamber 602. The optional internal plasma grid 650 limits the amount of hot electrons in the lower sub-chamber 603. In some embodiments, the apparatus is designed and operated such that the plasma present in the lower sub-chamber 603 is an ion-ion plasma.

Both the upper electron-ion plasma and the lower ion-ion plasma may contain positive and negative ions, though the ion-ion plasma will have a greater ratio of negative ions to positive ions. Volatile etching and/or deposition byproducts may be removed from the lower-sub-chamber 603 through port 622. The chuck 617 disclosed herein may operate at elevated temperatures ranging between about 10° C. and about 850° C. The temperature will depend on the process operation and specific recipe.

Chamber 601 may be coupled to facilities (not shown) when installed in a clean room or a fabrication facility. Facilities include plumbing that provide processing gases, vacuum, temperature control, and environmental particle control. These facilities are coupled to chamber 601, when installed in the target fabrication facility. Additionally, chamber 601 may be coupled to a transfer chamber that allows robotics to transfer semiconductor wafers into and out of chamber 601 using typical automation.

In some embodiments, a system controller 630 (which may include one or more physical or logical controllers) controls some or all of the operations of a processing chamber. The system controller 630 may include any one or more characteristic described above with respect to system controller 550.

Figure 7:
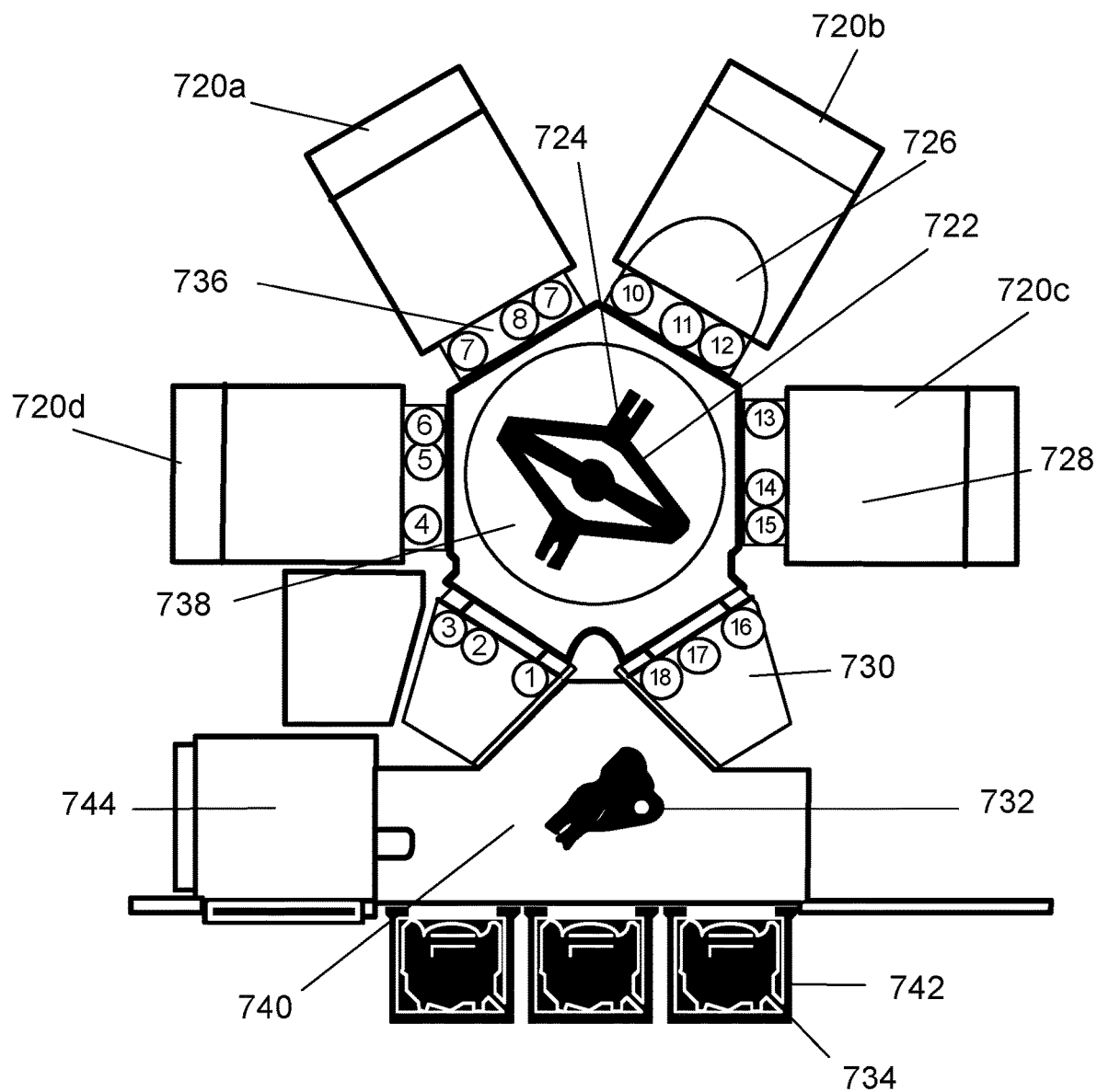

FIG. 7 depicts a semiconductor process cluster architecture with various modules that interface with a vacuum transfer module 738 (VTM). The arrangement of transfer modules to "transfer" wafers among multiple storage facilities and processing modules may be referred to as a "cluster tool architecture" system. Airlock 730, also known as a loadlock or transfer module, is shown in VTM 738 with four processing modules 720a-720d, which may be individual optimized to perform various fabrication processes. By way of example, processing modules 720a-720d may be implemented to perform substrate etching, deposition, ion implantation, wafer cleaning, sputtering, and/or other semiconductor processes. In some embodiments, ALD and selective etching are performed in the same module. In some embodiments, ALD and selective etching are performed in different modules of the same tool. One or more of the substrate etching processing modules (any of 720a-720d) may be implemented as disclosed herein, i.e., for depositing conformal films, selectively depositing films by ALD, etching patterns, and other suitable functions in accordance with the disclosed embodiments. Airlock 730 and process module 720 may be referred to as "stations." Each station has a facet 736 that interfaces the station to VTM 738. Inside each facet, sensors 1-18 are used to detect the passing of wafer 726 when moved between respective stations.

Robot 722 transfers wafer 726 between stations. In one embodiment, robot 722 has one arm, and in another embodiment, robot 722 has two arms, where each arm has an end effector 724 to pick wafers such as wafer 726 for transport. Front-end robot 732, in atmospheric transfer module (ATM) 740, is used to transfer wafers 726 from cassette or Front Opening Unified Pod (FOUP) 734 in Load Port Module (LPM) 742 to airlock 730. Module center 728 inside process module 720 is one location for placing wafer 726. Aligner 744 in ATM 740 is used to align wafers.

In an exemplary processing method, a wafer is placed in one of the FOUPs 734 in the LPM 742. Front-end robot 732 transfers the wafer from the FOUP 734 to an aligner 744, which allows the wafer 726 to be properly centered before it is etched or processed. After being aligned, the wafer 726 is moved by the front-end robot 732 into an airlock 730. Because airlock modules have the ability to match the environment between an ATM and a VTM, the wafer 726 is able to move between the two pressure environments without being damaged. From the airlock module 730, the wafer 726 is moved by robot 722 through VTM 738 and into one of the process modules 720a-720d. In order to achieve this wafer movement, the robot 722 uses end effectors 724 on each of its arms. Once the wafer 726 has been processed, it is moved by robot 722 from the process modules 720a-720d to an airlock module 730. From here, the wafer 726 may be moved by the front-end robot 732 to one of the FOUPs 734 or to the aligner 744.

It should be noted that the computer controlling the wafer movement can be local to the cluster architecture, or can be located external to the cluster architecture in the manufacturing floor, or in a remote location and connected to the cluster architecture via a network. A controller as described above with respect to FIG. 5 may be implemented with the tool in FIG. 7.

Experimental

An experiment was conducted for depositing gapfill silicon oxide material into gaps having an aspect ratio of 4:1 and openings of 30 nm and greater over patterned core material on a substrate. Multiple deposition cycles of the following operations were performed for each of three substrates: silicon-containing precursor dose, purge, oxygen/argon with plasma, purge. The first substrate was deposited at 50° C., the second substrate was deposited at 200° C., and thethird substrate was deposited at 400° C. All three substrates exhibited good fill capability at the corresponding temperatures, which suggests wide applicability for using gapfill material. Film density varies at different temperatures, with higher film density at higher deposition temperatures.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method comprising:
providing a substrate having a target layer, a patterned core material over the target layer, and gaps between the patterned core material;
depositing gapfill material comprising a material selected from the group consisting of silicon oxide, silicon nitride, and silicon carbide conformally on the patterned core material by atomic layer deposition for a duration sufficient to fill the gaps with the gapfill material on the substrate;
after depositing the gapfill material, planarizing the substrate by chemical mechanical planarization to form a planar surface comprising the gapfill material and the patterned core material, wherein planarizing the substrate causes the gapfill material to be symmetrically shaped, thereby forming symmetrically shaped spacers comprising the gapfill material;
performing an etching process to selectively remove the patterned core material relative to the gapfill material; and
etching the target layer using the symmetrically shaped spacers as a mask,
wherein the symmetrically shaped spacers have a planar top profile with vertical surfaces of the symmetrically shaped spacers oriented at or about 90° from a top horizontal surface of the symmetrically shaped spacers after the planarizing, and
wherein the patterned core material is selected from the group consisting of spin on carbon, diamond-like carbon, and gapfill ashable hard mask,
wherein the mask used to etch the target layer consists essentially of the symmetrically shaped spacers.

2. The method of claim 1, wherein the gaps in the patterned core material prior to depositing the gapfill material have aspect ratios greater than about 20:1.

3. The method of claim 1, wherein the gaps have openings less than about x nm and the gapfill material is deposited for a duration sufficient to deposit the gapfill material to a thickness of about 0.5×x nm.

4. The method of claim 3, wherein x is 50.

5. The method of claim 4, wherein x is less than 50.

6. The method of claim 1, wherein critical dimension between symmetrically shaped spacers in the mask is less than about 50 nm.

7. The method of claim 1, wherein the symmetrically shaped spacers are used for double or quad patterning techniques.

8. The method of claim 1, further comprising prior to depositing the gapfill material, depositing another conformal film over the substrate and directionally etching the another conformal film to form spacers on sidewalls of the patterned core material.

9. The method of claim 1, wherein depositing the gapfill material comprises exposing the substrate to alternating pulses of a silicon-containing precursor and an oxidizing plasma.

10. The method of claim 1, wherein the gapfill material is deposited such that a seam is formed in the gapfill material on the substrate.

11. The method of claim 1 wherein the gapfill material is deposited for a duration sufficient to form an overburden on the substrate.

12. The method of claim 1, wherein the gapfill material is deposited directly on the patterned core material.

13. A method comprising:
providing a substrate having a target layer, a patterned core material over the target layer, and gaps between the patterned core material;

depositing gapfill material selected from the group consisting of silicon oxide, silicon nitride, and silicon carbide conformally on sidewalls of the patterned core material by atomic layer deposition for a duration sufficient to completely fill the gaps with the gapfill material on the substrate;

immediately after depositing the gapfill material, planarizing the substrate by chemical mechanical planarization to form a planar surface comprising the gapfill material and the patterned core material, wherein planarizing the substrate causes the gapfill material to be symmetrically shaped, thereby forming symmetrically shaped spacers comprising the gapfill material;

after planarizing the substrate, performing an etching process to selectively remove the patterned core material relative to the gapfill material to leave the symmetrically shaped spacers; and etching the target layer using an etch mask consisting essentially of the symmetrically shaped spacers, wherein the symmetrically shaped spacers have a planar top profile with vertical surfaces of the symmetrically shaped spacers oriented at or about 90° from a top horizontal surface of the symmetrically shaped spacers after the planarizing, and wherein the patterned core material is selected from the group consisting of spin on carbon, diamond-like carbon, and gapfill ashable hard mask.

14. A method comprising:

providing a substrate having a target layer; a patterned core material over the target layer; and gaps between the patterned core material;

depositing gapfill material comprising a single material selected from the group consisting of silicon oxide, silicon nitride, and silicon carbide conformally over sidewalls of the patterned core material such that gapfill material is deposited in the gaps on the substrate for a duration sufficient to fill the gaps;

after depositing the gapfill material, planarizing the substrate by chemical mechanical planarization to form a planar surface comprising the gapfill material and the patterned core material, wherein planarizing the substrate causes the gapfill material to be symmetrically shaped and have a horizontal planar top profile, thereby forming symmetrically shaped spacers comprising the gapfill material; and selectively etching the patterned core material relative to the gapfill material to form the symmetrically shaped spacers, and etching the target layer using a mask consisting essentially of the symmetrically shaped spacers, and wherein the patterned core material is selected from the group consisting of spin on carbon, diamond-like carbon, and gapfill ashable hard mask, wherein the gaps in the patterned core material prior to depositing the gapfill material have aspect ratios greater than about 20:1.

* * * * *